United States Patent

Horn

[11] Patent Number: 5,925,494
[45] Date of Patent: *Jul. 20, 1999

[54] VAPOR DEPOSITION OF POLYMER FILMS FOR PHOTOLITHOGRAPHY

[75] Inventor: Mark W. Horn, North Chelmsford, Mass.

[73] Assignee: Massachusetts Institute of Technology, Cambridge, Mass.

[*] Notice: This patent issued on a continued prosecution application filed under 37 CFR 1.53(d), and is subject to the twenty year patent term provisions of 35 U.S.C. 154(a)(2).

[21] Appl. No.: 08/602,431
[22] Filed: Feb. 16, 1996
[51] Int. Cl.⁶ ............................. G03F 7/075; G03F 7/004
[52] U.S. Cl. .................. 430/270.1; 427/488; 528/220; 528/396; 430/296
[58] Field of Search .................. 430/270.1; 427/488; 528/220, 396

[56] References Cited

U.S. PATENT DOCUMENTS

| | | | |
|---|---|---|---|
| 4,547,395 | 10/1985 | Hall et al. | 427/54.1 |
| 4,632,844 | 12/1986 | Yanagihara et al. | 427/38 |
| 4,693,799 | 9/1987 | Yanagihara et al. | 204/165 |
| 4,892,617 | 1/1990 | Bates et al. | 156/659.1 |
| 5,002,794 | 3/1991 | Ratner et al. | 427/41 |
| 5,017,403 | 5/1991 | Pang et al. | 427/39 |
| 5,094,936 | 3/1992 | Misium et al. | 430/325 |
| 5,112,457 | 5/1992 | Marchant | 204/165 |
| 5,123,998 | 6/1992 | Kishimura | 156/643 |
| 5,139,925 | 8/1992 | Hartney | 430/326 |
| 5,217,851 | 6/1993 | Kishimura et al. | 430/325 |
| 5,318,870 | 6/1994 | Hartney | 430/18 |
| 5,322,764 | 6/1994 | Kamiyama et al. | 430/324 |
| 5,362,606 | 11/1994 | Hartney et al. | 430/315 |
| 5,427,649 | 6/1995 | Kim et al. | 156/661.11 |
| 5,439,780 | 8/1995 | Joshi et al. | 430/296 |
| 5,455,040 | 10/1995 | Marchant | 424/426 |
| 5,565,304 | 10/1996 | Honda | 430/311 |

FOREIGN PATENT DOCUMENTS 568235  11/1993  European Pat. Off. .

OTHER PUBLICATIONS

"Topology", The Oxford English Dictionary, 2$^{nd}$ Ed, vol. XVIII, Clarendon Press, Oxford, United Kingdom, 1989, pp. 257–258, 1989.

"Wafer", The American Heritage Dictionary, Second College Edition, Hougton Mifflin Company, Boston, MA, 1976, p. 1359.

Hartney et al., "Silylation processes based in ultraviolet laser–induced crosslinkiing," *J. Vac. Sci Technol.* B, vol. 8, No. 6, pp. 1476–1480, Nov./Dec. 1990.

(List continued on next page.)

*Primary Examiner*—Cynthia Hamilton
*Attorney, Agent, or Firm*—Theresa A. Lober

[57] ABSTRACT

The invention provides a method for vapor-depositing a polymer film having constituents that are synthesized during the deposition and that can therefore be customized by time-dependent process control during the deposition. In the vapor-deposition process, a hydrocarbon precursor is reacted with an oxygen-containing precursor in a plasma environment. The plasma reaction synthesizes O—H bonds and forms a polymer having O—H bonds, C—C bonds, and C—H$_x$ bonds. Preferably, the hydrocarbon and oxygen-containing precursors are employed in a ratio selected such that the resulting polymer film has a selected level of oxygen constituency providing a corresponding selected ratio of O—H bond concentration to C—H$_x$ bond concentration. The precursor ratio is preferably varied as a function of time during the plasma reaction to result in a corresponding distribution, e.g., a depth-dependent distribution, of O—H bonds in the film. The vapor-deposited polymer film provided by the invention is particularly well-suited as an all-dry positive-tone silylation photoresist because the vapor-deposition process can custom-synthesize a constituent hydroxyl group concentration and distribution in the photoresist film for a given photolithographic application.

14 Claims, 14 Drawing Sheets

OTHER PUBLICATIONS

Sezi et al., "Benefits and prospects of aqueous silylation for novel dry developable high resolution resists," *SPIE*, vol. 1262, "Advances in Resist Tech. and Process. VIII" pp. 84–93, 1990.

Hartney et al., "Silylation processes for 193–nm excimer laser litohgraphy," *SPIE*, vol. 1262, "Advances in Resist Tech. and Process. VII," pp. 119–130, 1990.

Babich et al., "Comparison of vapor and liquid phase silylation processes of photoresists," *Microeletronic Engineering*, vol. 13, pp. 47–50, 1991.

Hartney et al., "Positive–tone silylation processes at 193nm," *Microeletronic Engineering*, vol. 13, pp. 51–56, 1991.

Hartney, "Evaluation of Phenollic Resists for 193–nm Surface Imaging," *SPIE*, vol. 1466, "Advances in Resist Tech. and Process. VIII," pp. 238–247, 1991.

Dao et al., "Study of silylation mechanism and kinetics through variations in silylation agent and resin, " *SPIE* vol. 1466, "Advances in Resist Tech. and Process. VIII," pp. 257–268, 1991.

Vinet et al., "Resist Design For Dry Devpd. Positive Working Systems In Deep UV and E Beam Lithography," *SPIE* vol. 1466, "Advances in Resist Tech. and Process. VIII, " pp. 558–569, 1991.

Horn et al., "A Comparison of Etching Tools for Resist Pattern Transfer," *SPIE* vol. 1672, "Advances in Resist Tech. and Process. IX," pp. 448–460, 1992.

Hartney, "Silylation Processes for 193–nm Lithography Using Acid–Catalyzed Resists," *SPIE* vol. 1672, "Advances in Resist Tech. and Process. IX," pp. 486–498, 1992.

Kunz et al., "Dry–Developed Organosilicon Resists for 193–nm Excimer Laser Lithography," *Polymer Engineering and Science*, vol. 32, No. 21, pp. 1595–1599, Mid–Nov., 1992.

Rothschild et al., "Photolithography at 193 nm," *J. Vac. Sci. Technol.* B, vol. 10, No. 6, pp. 2989–2996, Nov./Dec. 1992.

Johnson et al., "Surface Imaging Resists for 193 nm Lithography," *Jpn. J. Appl. Phys.*, vol. 31, Part 1, No. 12B. pp. 4321–4326, Dec. 1992.

Hartney, "Modeling of positive–tone silylation processes for 193–nm lithography," *J. Vac. Sci. Technol.* B, vol. 11, No. 3, pp. 681–687, May/Jun. 1993.

Leuschner et al., "Patterning of Organic Layers Using Negative and Positive Working Top–Carl Process," *Microelectronic Engineering*, vol. 21, pp. 255–258, 1993.

Joshi et al., "Plasma Deposited Organosilicon Hydride Network Polymers as Versatile Resists for Entirely Dry Mid–Deep UV Photolithography," *SPIE* vol. 1925, pp. 709–720, 1993.

Hartney et al., "Comparison of Liquid–and Vapor–Phase Silylation Processes for 193–nm Positive–Tone Lithography," *SPIE* vol. 1925, pp. 270–278, 1993.

Klumpp et al., "All–dry Siloxane Based Resist System: Plasmainduced Chemical Vapor Deposition and Reactive Ion Etch Develop.," *Microelectronic Engineering*, vol. 23, pp. 275–278, 1994.

Zhang et al., "A liquid phase silylation process for 248 nm lithography using EL IR photoresist," *SPIE* vol. 2195, pp. 506–511, 1994.

Horn et al., "All–Dry Resist Processes for 193–nm Lithography," Proc. Reprint–SPIE 1995 Int. Symp. on Microlithography, SPIE vol. 2438, pp. 760–761, Santa Clara, CA, Feb. 20–22, 1995.

Horn et al., "All–Dry Resist Processes for 193–nm Lithography," Abst. and Tech. Program–SPIE 1995 Int. Symp. on Microlithography, p. 17 and p. 89, Santa Clara, CA, Feb. 19–24, 1995.

Horn et al., "Plasma–deposited silylation resist for 193 nm lithography," *Appl. Phys. Lett.*, vol. 68, No. 2, pp. 179–181, Jan. 8, 1996.

Kunz et al., "Top–Surface Imaged Resists for 193–nm Lithography," Chapter 18, pp. 271–280, ACS Symposium Series, "Microelectronics Technology: Polymers for Advanced Imaging and Packaging," Reichmanis et al. Eds., 209th ACS meeting, Anaheim, CA, Apr. 2–6, 1995.

"Several New Ideas to Develop 'All Dry' Resist Processing for Optical Lithography," Industry News, *Semiconductor International*, pp. 17–18, May 1995.

VAPOR DEPOSITION OF POLYMER FILMS FOR PHOTOLITHOGRAPHY

GOVERNMENT RIGHTS IN THE INVENTION

This invention was made with U.S. Government support under Air Force Contract Number F19628-90-C-002. The U.S. Government has certain rights in this invention.

FIELD OF THE INVENTION

This invention relates to processes for producing polymer films, and more to particularly relates to techniques for forming polymer photoresist films for use in semiconductor photolithography processes.

BACKGROUND OF THE INVENTION

Semiconductor photolithography generally involves a sequence of processes in which a photoresist layer is applied to, e.g., a semiconductor wafer, and the photoresist layer is exposed to radiation in a pattern corresponding to a desired semiconductor processing pattern. The exposed photoresist is typically then processed to form a patterned barrier film for a subsequent wafer process or processes. Photoresist films generally and historically consist of a polymer resin, in addition to other optional components. A polymer-based photoresist film can be processed with radiation to induce photochemical reactions in localized regions of the film corresponding to a pattern of the radiation, and these selective reactions enable a precise optical-based mechanism for producing a desired barrier pattern in a photoresist film.

In a conventional photolithographic process, a polymer photoresist is applied to a wafer as a liquid by spin-coating one or more layers of the photoresist on the wafer. This is accomplished by, for example, placing a few drops of a liquid polymer-solvent solution on a wafer as the wafer is rapidly spun on a support platform. The spin-applied liquid polymer is then typically heat-treated to evaporate the solvent and stabilize the film. Next, the film is exposed to radiation through a patterned mask, e.g., a glass plate having chrome patterns, such that only selected regions of the film are exposed to the radiation and undergo radiation-induced chemical reactions. Typically, a so-called positive-tone photoresist film is developed after this exposure step in an aqueous or solvent liquid developing solution to remove the film from the exposed areas; a so-called negative-tone photoresist film is developed to remove the unexposed areas of the film. After development, both positive- and negative-tone photoresist films result in an acid-resistant, patterned coating over selected regions of the substrate.

The optical resolution limits of this conventional liquid-developed photolithographic process have led to the development of many alternative and advanced photolithographic techniques and photoresist films. The class of photoresist films known as silylation resists provide one approach for achieving fine lithographic line widths by employing a dry, rather than liquid-based, photoresist development system. In a typical silylation-based lithography process, a liquid silylation photoresist is spin-applied to a wafer in much the same way a more conventional liquid polymer resist is spin-applied. In a positive-tone silylation resist film, exposure to a pattern of radiation induces a change in the radiated polymer regions that results in a surface permeation barrier, the surface barrier suppressing permeation of a silicon-containing compound into those regions in a later processing step. A negative-tone silylation resist film is characterized by photo-induced chemical reaction of the film in unexposed regions of the film, those unexposed regions providing a selective permeation barrier to a silicon-containing compound in a later processing step.

Considering the case of a positive-tone silylation photoresist, the silylation resist consists of a polymer resin that includes hydroxyl bond groups dispersed throughout the resin. The photochemical changes induced by the radiation exposure of the film results in the illuminated regions being crosslinked. Subsequent exposure of the film to a so-called silylation reagent, in the form of a silicon-based liquid or silicon-containing vapor, results in a chemical reaction between the silicon-containing reagent and the hydroxyl groups in those regions of the film that were not illuminated. The silylation reagent does not penetrate into the illuminated, crosslinked areas of the film. A desired pattern corresponding to the radiation exposure pattern is then produced by exposing the silylated film to an appropriate dry-development process, e.g., an anisotropic oxygen plasma etch. The film areas that were not crosslinked and that were therefore silylated convert to an $SiO_x$ film in the oxygen plasma and form a surface etch barrier to the plasma. The cross-linked areas are, however, attacked by the plasma and are removed. This anisotropic etch step is analogous to the liquid development step of conventional photolithography and results in patterning of selected photoresist film regions to produce a patterned barrier film for subsequent wafer processing.

Spin-applied liquid silylation resists have historically been limited by the homogeneous nature of the constituent species in the starting resist liquid. The volume concentration and localized profile of hydroxyl sites in a silylation resist film determine to a degree the contrast, resolution, etch resistivity, and other such characteristics of the film. For many silylation photoresist applications, it would be desirable to tailor the profile of constituent species in a photoresist film based on performance goals for specific lithographic or etch processes. But profile tailoring of spin-applied films is in general very limited, if not impossible, for several reasons. First, the chemistry of spin-applied layers is limited to the original polymer synthesis in the starting liquid. In addition, spin-applying of thin films with the uniformity required for sub-0.25 $\mu$m photolithographic resolution is very difficult to physically control, particularly over wafer topography. Furthermore, the "stacking" of multiple spin-applied film layers introduces an abrupt physical and chemical interface between each of the film layers.

Multi-layer resists (MLR) have also been investigated as an alternative to conventional wet-developed, single layer resists. Examples of MLRs include combinations of spin-applied and dry-deposited films. These MLR systems are not, in general, based on a silylation patterning process and are thus fundamentally limited because they cannot enable a silylation mechanism, and are further limited by the use of more than one development step. In addition, MLRs inherently have at least one abrupt interface that is a chemical, physical, or both a chemical and physical interface.

Spin-applied silylation photoresists, and spin-applied polymer photoresists in general, all pose costly waste and disposal problems that have chronically faced the semiconductor fabrication industry. In addition, concerns for operator safety during handling of spin-applied photoresists have historically been a processing issue. Aside from safety considerations, spin-applied photoresists pose fabrication limitations that are of increasing importance as the complexity of fabrication development advances. For example, a selected fabrication substrate or film may be reactive with the solvents in a liquid photoresist solution, or may be reactive with liquid developers used in a photolithography process to develop an exposed photoresist film. Beyond the limitations of liquid photolithography chemicals themselves, a selected fabrication substrate or film may be easily contaminated by handling during spin-coating of a photoresist film on the substrate, and may be prone to unwanted oxidation in ambient exposure during the spin-coating process. As a result, spin-applied liquid photoresists are sub-optimal for many substrate materials.

A more complicated limitation is posed by the various substrate materials that currently are not available in standard sizes and shapes, making such substrates entirely incompatible with a standard spin-coating process. For example, exotic substrates, such as HgCdTe substrates, are typically supplied in rectangular or other nonsymmetrical, rather than circular, geometry, thus making uniform spin-coating of photoresist films not possible as a practical matter for production processes. Similarly, the substrates required for many fabrication applications are of such large dimensions that physical spinning of the substrates is not possible without specialized equipment. For example, very large substrates employed in fabricating flat panel display systems cannot be physically spun. As a result, complicated and expensive alternative thin film application processes, such as squeegee techniques, have been developed to produce photoresist films on such large substrates. The topological dimensions of a substrate also limit its ability to enable a uniform spin-coating of photoresist. Many substrates that support fabrication of mechanical components as well as electrical components, as is the case for, e.g., microelectromechanical sensor or actuator systems, include varying degrees of topography that cannot be effectively coated with a spin-applied photoresist film. Thus, while spin-applied photoresist films have been sufficiently developed to enable photolithography on very standard substrate materials and sizes, such photoresist films are inadequate for and/or incompatible with an increasing number of substrates encountered as semiconductor fabrication processes continue to evolve.

SUMMARY OF THE INVENTION

The invention overcomes limitations of spin-applied photoresist films by providing a method for vapor-depositing a polymer film whose constituents are synthesized during the deposition and can therefore be customized by time-dependent process control during the deposition. This is enabled by the invention with a method for forming a polymer film by reacting a hydrocarbon precursor with an oxygen-containing precursor in a plasma environment. The plasma reaction synthesizes O—H bonds and forms a polymer having C—C bonds, C—$H_x$ bonds, and O—H bonds.

Preferably, the hydrocarbon and oxygen-containing precursors used in the plasma reaction are in a selected ratio such that the resulting polymer film has a selected level of oxygen constituency providing a corresponding selected ratio of O—H bond concentration to C—$H_x$ bond concentration. The precursor ratio is preferably varied as a function of time during the plasma reaction to result in a corresponding distribution, e.g., a depth-dependent distribution, of O—H bonds in the film.

In one preferred process, a first synthesis is accomplished by decomposing a hydrocarbon precursor in a plasma environment to synthesize a lower polymer layer having C—C bonds and C—$H_x$ bonds, and then the hydrocarbon and oxygen-containing precursors are plasma-reacted to synthesize an upper polymer layer having C—C bonds, C—$H_x$ bonds, and O—H bonds. The upper polymer layer and lower polymer layer together form a continuous polymer film. In another preferred process, after first decomposing a hydrocarbon precursor to synthesize a lower polymer layer having C—C bonds and C—$H_x$ bonds, hydrocarbon and oxygen-containing precursors are plasma-reacted and the ratio of hydrocarbon precursor to oxygen-containing precursor is varied as a function of time during the reaction to synthesize a middle polymer layer and an upper polymer layer. The middle and upper layers preferably have C—C bonds and C—$H_x$ bonds, and the middle layer preferably has a relatively higher concentration of O—H bonds than the upper polymer layer. Preferably, the hydrocarbon precursor is an unsaturated cyclic hydrocarbon and the oxygen-containing precursor is a gas that includes oxygen.

The polymer film that results from the plasma reaction preferably has an O—H bond concentration that is distributed through the polymer as a function of film depth; e.g., varying through the film depth from a relatively higher concentration at shallow depths to a relatively lower concentration at lower depths, from a relatively lower concentration at shallow depths to a relatively higher concentration at central depths and zero concentration at lower depths, or homogeneously distributed through the depth of the film. In one preferred embodiment, a silicon constituent is incorporated into the polymer to at O—H bonds.

The invention also provides a method for forming a pattern on a substrate. In the method, a polymer film is vapor-deposited on the substrate by reacting a hydrocarbon precursor with an oxygen-containing precursor in a plasma environment to form on the substrate a film of polymer having C—C bonds, C—$H_x$ bonds, and O—H bonds synthesized by the precursor reaction. Then the deposited film is exposed to a pattern of radiation to induce photochemical reactions in the film and form a corresponding pattern of crosslinked diffusion-barrier regions. The radiated film is then exposed to a silicon-containing environment under pressure and temperature conditions sufficient to incorporate silicon into un-crosslinked film regions. Finally, the silicon-exposed film is etched to remove the crosslinked diffusion-barrier film regions, the remaining film regions providing a pattern on the substrate.

Preferably, during the vapor-deposition of the polymer film, the ratio of hydrocarbon precursor to oxygen-containing precursor is controlled to produce a three-layer, continuous film having a lower carbon-based layer optimized for etch resistivity, a middle layer that includes a concentration of O—H bonds optimized for incorporating silicon into the polymer film, and an upper layer that includes a relatively lower O—H bond concentration optimized for photosensitivity and photolithographic contrast.

In preferred processes, the radiated film is exposed to a vapor-phase silylamine under pressure and temperature conditions that are sufficient to induce diffusion of the silylamine into the film and enable a chemical reaction to occur between the silylamine and the O—H bond moieties in the film. The resulting silicon-exposed film is preferably etched in an oxygen plasma. It is further preferable that the steps of vapor-deposition, radiation exposure, silylamine exposure, and oxygen plasma etch all be carried out in sequence without exposing the substrate to the ambient environment between each step.

In other preferred processes, the radiation to which the deposited film is exposed is between about 10 nm and about 400 nm in wavelength, is an ion beam, or is an electron beam.

The vapor-deposition process and polymer films produced by it provides the ability to synthesize a silylation photoresist that has performance properties tailored to a specific application. The process enables silylation lithography on substrate materials that could react with solvents or liquid developers, those that require minimal handling, and those prone to contamination or oxidation. The polymer film of the invention can be deposited on any size or shape of substrate, and over varying degrees of topography. In addition, the plasma-reaction enabled by the deposition process accommodates lithographic process flexibility through in situ synthesis that can be tailored to a specific lithographic application. Employed as a positive-tone silylation photoresist, the polymer films of the invention have been found to perform at least as well as conventional spin-applied silylation photoresists. Other features and advantages of the film deposition process and resulting polymer film of the invention will become apparent from the following detailed description, from the figures, and from the claims.

DETAILED DESCRIPTION

A carbon-based polymer film in accordance with the invention is deposited on a substrate by a vapor deposition process that eliminates the need for spinning a liquid phase of the polymer on the substrate. This enables formation of carbon-based polymer films for use as photoresists on a wide range of substrates including those having dimensions that are not amenable to conventional spin-coating of liquid polymer photoresist films. As explained in detail below, the vapor deposition process of the invention also provides many advantages for tailoring the properties of a deposited polymer film for specific processing applications and performance goals.

The vapor deposition process of the invention accommodates the ability to tailor properties of a deposited polymer film by synthesizing the polymer through plasma reaction of precursor compounds. The nature of the plasma synthesis can result in a film that is more amorphous and that has a more randomly bound network of monomers than is characteristic of conventionally synthesized polymer films. Nevertheless, plasma-synthesized films provided by the invention retain many of the chemical and mechanical properties provided by conventionally-synthesized polymer films. The term polymer is thus here meant to characterize a broad range of films that do not necessarily exhibit long range ordering or conventional monomer chain branching but that exhibit chemical and mechanical properties typically associated with the class of materials known as polymers.

The vapor-deposited polymer film of the invention is particularly well-suited as an all-dry positive-tone silylation photoresist because the plasma synthesis process to produce the film, described below, can custom-synthesize a constituent hydroxyl group concentration and distribution, e.g., depth distribution. In conventional, spin-applied silylation photoresist films, the hydroxyl site concentration is fixed by the homogeneous nature of the liquid photoresist polymer, thus limiting the amount and location of silicon uptake per unit volume that is achieved by a silylation process. In contrast, the vapor-deposited silylation film of the invention enables precise control of the silylation, leading to greater flexibility in the performance of the photoresist.

Figure 1:
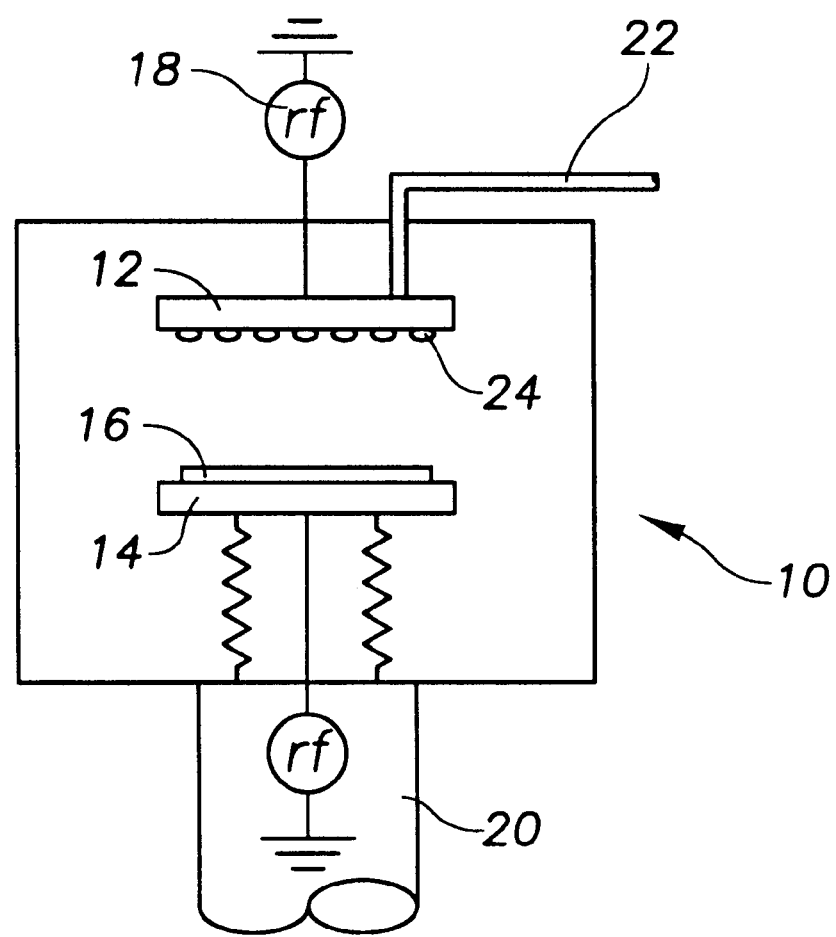
FIG. 1 is a schematic of an example plasma chamber suitable for carrying out the vapor-deposition process provided by the invention.

An exemplary vapor-deposition process, plasma-enhanced chemical vapor deposition (PECVD), in accordance with the invention can be carried out in a conventional parallel-plate plasma processing chamber like that shown in FIG. 1. The plasma chamber 10 consists of, for example, upper and lower electrodes 12, 14, respectively; a substrate 16 on which a polymer film is to be deposited is supported by the lower electrode 14. Preferably, this lower electrode also provides temperature control of the substrate. A source of ionizing radiation such as an RF power source 18 is applied to either the upper or lower electrodes, or both electrodes, to produce a plasma of the precursor species that will chemically react to form the polymer film. Power sources at other radio frequencies, e.g., microwave frequencies, or other systems which enable a capacitive or inductive DC glow discharge, or other suitable power source, can also be employed.

The invention contemplates a wide range of alternative plasma systems that are suitable for vapor-deposition. For example, ion-induced chemical vapor deposition systems or ion assisted chemical vapor deposition systems employing a focused or broad ion beam are suitable. In general, the vapor-deposition process of the invention contemplates any processing system that enables reaction of chemical vapor precursor species to deposit a desired film composition, without limitation to the particular mechanism by which reaction of vapor precursor species is initiated. For many applications, a PECVD system may be preferable because the various reaction, adsorption, and deposition mechanisms of this system are well-characterized.

Referring back to FIG. 1, in an example PECVD system in accordance with the invention, a concentric pumping system 20, utilizing, e.g., a turbomolecular pump or roots blower pumping system, is provided to attain a desired pressure in the plasma chamber. The plasma system is preferably load-locked, and can be evacuated, as is typical, a base pressure of about, e.g., $1 \times 10^{-7}$ Torr. In one exemplary configuration, precursor gases for forming the polymer film are introduced into the plasma chamber by way of a gas source line 22 which, for some applications, is preferably temperature-controlled. All of the precursor gases may be fed through this one line, or alternatively, multiple lines can be employed.

The vapor-deposition process of the invention, e.g., PECVD, employs as precursors a volatile hydrocarbon material and an oxygen-containing compound that together react in the plasma environment to produce hydroxyl sites in a polymer film as that film is deposited. Unsaturated hydrocarbon monomers that contain the requisite hydroxyl groups have very low vapor pressure at room temperature and thus are not easily adaptable as a deposition precursor source; for example, phenol has a vapor pressure of less than about 1 Torr at about 40° C. The use of such low vapor pressure compounds would require a specialized deposition system that could provide heated gas lines, a heated source, and a low vapor-pressure mass flow controller, and may have a maximum flow rate that is lower than that necessary for single-wafer production processing.

Given the complexities of this system, the PECVD process of the invention instead synthesizes hydroxyl groups from precursors that do not themselves include such groups. Thus, unlike spin-applied silylation photoresists in which hydroxyl groups are present in the starting liquid in a homogeneous distribution, the hydroxyl groups are here synthesized in situ during the deposition, and their concentration and depth profile can accordingly be tailored by way of deposition process control, as outlined below.

The hydrocarbon precursor material is provided in the PECVD process of the invention as a hydrocarbon gas or liquid. Precursors of high vapor pressure, in the gas phase, can be introduced through conventional mass flow controllers to the chamber gas source line 22 and through a shower head 24 in the upper electrode 12. Lower vapor pressure liquid precursor sources can be introduced directly, relying on the pressure of the gas delivery system, as described in more detail below, or using a mass flow controller that is designed for liquid sources such as TEOS or HMDS. In this case, the upper electrode need not be powered, and is used only to assist in cleaning of the chamber.

Almost any volatile hydrocarbon material can be employed as one of the sources for the vapor-deposited film. Gases such as benzene, cyclopentene, toluene, norbornodiene, cycloheptatriene (CHT), cyclohexene, isoprene, or other hydrocarbons can be employed. Oxygen-, fluorine-, chlorine-, or bromine-containing hydrocarbon precursors can also be used. In general, high carbon to hydrogen ratio precursors were found to yield higher deposition rates for any given set of process conditions, and thus may be preferable for many applications.

Almost any oxygen-containing compound can be employed to react with the hydrocarbon precursor for creating hydroxyl bonds in the deposited film. Water, air, methanol, ethanol, acetone, tetrahydorfuran, hydrofuran, or other volatile, oxygen-containing organic compound can be employed as the oxygen source. It was found that a precursor gas mixture consisting primarily of pure oxygen enabled the highest density of hydroxyl bonds, all other film properties being equal, and thus pure oxygen gas may be the preferable oxygen precursor for many applications.

In the invention, a substrate on which the carbon-based film is to be deposited is cleaned and loaded into the plasma chamber. Prior to introduction of the substrate, the chamber is preferably cleaned by, e.g.,. introducing oxygen gas or a fluorocarbon/oxygen gas mixture at a flow rate of between about 10–100 sccm and a pressure of about 300 mTorr for about 1–5 minutes. Physical scrubbing is also preferable after many deposition cycles. After the substrate is loaded in the chamber, the chamber is pumped to a suitable pressure, e.g., between about 0.01 Torr–10 Torr, and preferably between about 0.2–3 Torr.

Considering factors relating deposition pressure to characteristics of a deposited film, the generation of a plasma capacitively was found to become difficult in the system described above at pressures greater than about 2 Torr. However, there is no reason that a suitable carbon-based polymer film can not be produced at any desired pressure, given a corresponding reactor geometry and appropriate ionizing source. In general, at higher pressures, less dissociation of precursor compounds occurs per Watt of applied power. This results in the precursor materials having a greater impact on the constituents in the film as it is deposited. As a rule, the uniformity of a deposited film is dramatically affected by the combination of selected pressure, flow rate, and reactor geometry; in general, the deposition rate increases with increasing pressure for a given power input. In fact, all other parameters being constant, the deposition rate for a polymer film containing hydroxyl bonds was found to increase almost linearly from about 150 to 650 nm/min as pressure was increased from about 500 to 1500 mTorr.

During the vapor deposition process, the temperature of the substrate is preferably maintained by the lower electrode on which it is supported; a heat source is incorporated into the electrode. Preferably, the temperature of the substrate is maintained between about 0° C.–200° C. during deposition, and more preferably between about 5° C.–75° C. For ease of process control, room temperature may be preferable for many applications and has been successfully employed. Lower temperatures increase the physical adsorption of the precursors and thus are likely to increase deposition rate, as well as the amount of unreacted precursor that is incorporated in the film as it is deposited, making the films relatively more self-solvating. Higher temperatures can result in increased polymerization and lower deposition rates due to reduced physical adsorption. Considering the use of the deposited film as a silylation photoresist, a deposition temperature higher than the temperature set for the silylation reaction subsequent to the film deposition may be preferable to insure that the resist is thermally stable during that reaction. The high-temperature limit is the temperature at which decomposition of the precursor materials occurs.

To initiate synthesis and deposition of the carbon-based film, the upper and lower electrodes are positioned a suitable distance from each other, e.g., about 1–5 cm, and the precursor gases are introduced into the plasma chamber. Flow rates of between about 1–400 sccm are suitable. For the example deposition processes discussed below, the stated flow rates for the various precursor gases are approximate, and are based on a nitrogen-calibrated mass flow controller; the stated flow rates do not take a conversion calibration factor into account and are thus calibrated for a nitrogen gas.

An ionizing power source is then applied, such as an RF power of between about 10–500 W. It was found that relatively higher power levels yielded higher self-biases at a given pressure, which in turn resulted in higher-energy ion bombardment of the substrate during the deposition process. Higher power levels also tended to produce a higher degree of precursor material dissociation.

The ratio of precursor gas flow rates, as well as other variables such as pressure, power, temperature, and electrode spacing are preferably selected to avoid gas-phase polymerization of the precursors, particulate formation, and nonuniform deposition of the film, and to provide a desired concentration of synthesized hydroxyl sites. For example, it was found that at high total flow rates, pressures greater than about 600 mTorr, and an electrode spacing of about 2 cm, deposition nonuniformities resulted in the film reflecting the shower head pattern of the upper electrode. Also, at high deposition rates, e.g., greater than about 300 nm/min, the mechanical properties of the resulting film were found to vary between liquid and solid phases with only small changes in the RF power during the deposition.

The ratio of hydrocarbon to oxygen precursor flow rates is preferably controlled during the deposition process to achieve a desired concentration of hydroxyl bonds. It was found experimentally that the precursor flow rate ratio also affects the film deposition rate, as there can be competing deposition and etching reactions at the film surface. Specifically, there was found a trade off in processing conditions that create a high density of hydroxyl sites with those that enable a high deposition rate. Examples of processing conditions and the polymer film properties produced by those conditions will be discussed in detail below.

At the completion of film deposition to a desired thickness, the substrate on which the film was deposited is removed, e.g., using a robotic manipulator, from the PECVD chamber. The film can be then thermally stabilized, if desired, by a post-deposition bake on a hot plate at, e.g., 70° C., for about, e.g., 90 s. This baking process is similar to that employed with conventional spin-applied photoresists; it serves to drive off any unreacted monomers trapped in the film. If the film is deposited at a temperature above room temperature, the post-deposition bake may not be necessary or advantageous.

EXAMPLE 1

For any given level of hydroxyl bonds synthesized by the PECVD process of the invention, it is preferable that the unsaturated hydrocarbon monomer incorporated into the polymer from the hydrocarbon precursor retain some of the initial structure of the precursor, i.e., not be completely dissociated in the plasma reaction. The degree of hydrocarbon dissociation produced by the plasma reaction was investigated for two different hydrocarbon precursors, namely, benzene and cyclopentene.

Benzene was introduced to a plasma environment of about 900 mTorr, about 200 W of RF power, a gap spacing of about 3.0 cm, and a temperature of about 25° C., to form a carbon-based film. Given the relatively low vapor pressure of benzene, no mass flow controller was employed to introduce the precursor to the plasma chamber, but instead, the flow of benzene was regulated by the room-temperature vapor pressure of the gas and the conductance of the gas delivery tube and upper electrode shower head. In a separate process, cyclopentene was introduced to the plasma environment at a regulated flow rate of about 200 sccm and under the same processing conditions.

Figure 2A:
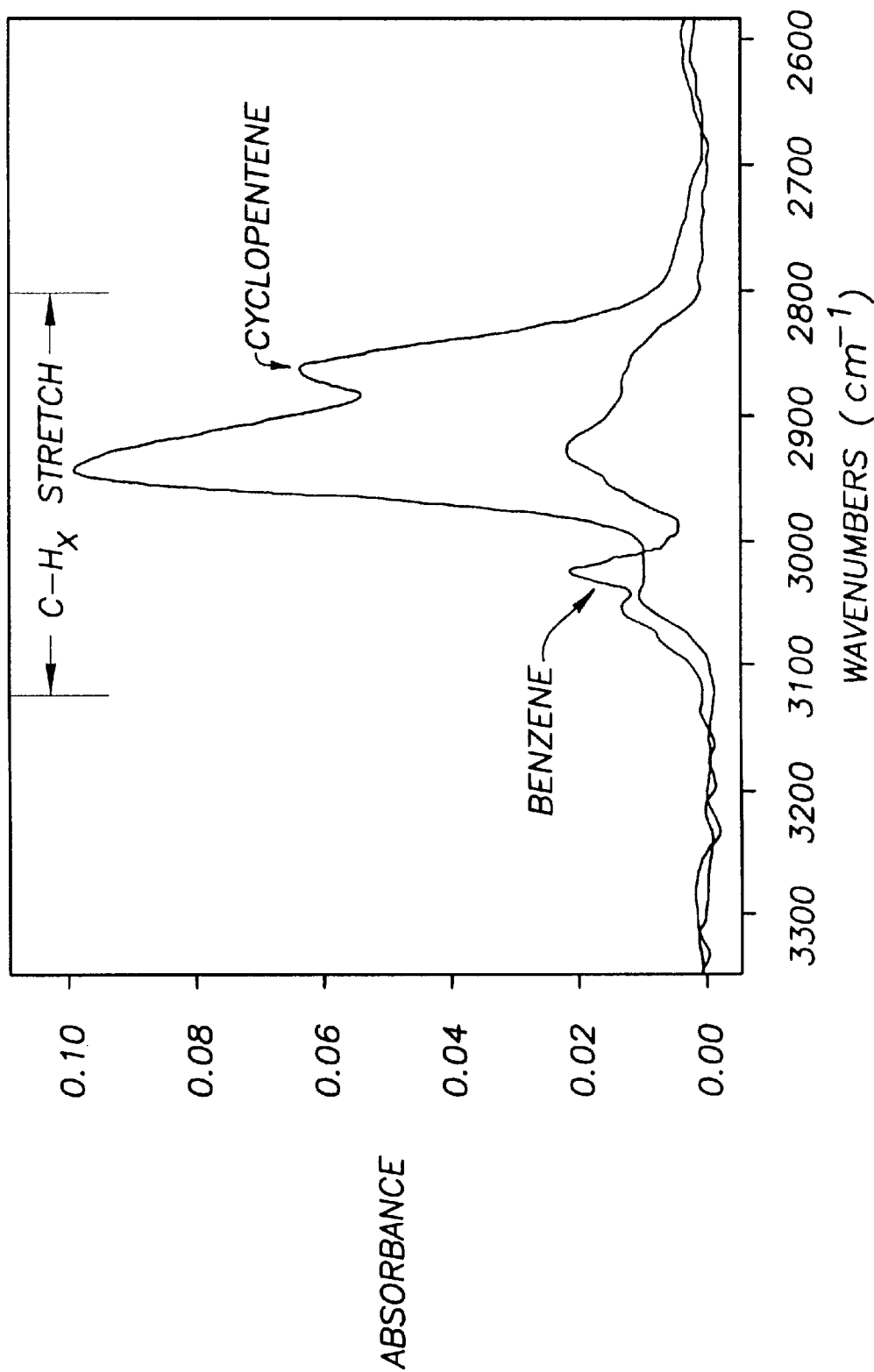
FIG. 2A, is a plot of FTIR absorbance for two films deposited in accordance with the invention, one employing benzene as a precursor and the other employing cyclopentene as a precursor.

The Fourier transform infrared spectroscopy (FTIR) absorbance spectrum of the two resulting films is plotted in FIG. 2A. Both the benzene-based film and the cyclopentene-based film exhibit peaks in the C—$H_x$ stretch region between 3100 cm$^{-1}$ and 2800 cm$^{-1}$, indicating that the hydrocarbon structure of the precursors is retained in the deposited films. This spectra indicate a distinct difference between the unsaturated C—$H_x$ peaks, which are at wavenumbers between 3000–3100 cm$^{-1}$, and the saturated C—$H_x$ peaks, which are between 2800–3000 cm$^{-1}$. The presence of unsaturated hydrocarbon bonds, particularly aromatic or cyclic bonds, in a plasma-deposited film, are believed to improve both the resistance of the film, when used as a photoresist during subsequent processing, and to improve the photosensitivity of the film, as explained in more detail below.

EXAMPLE 2

Figure 2B:
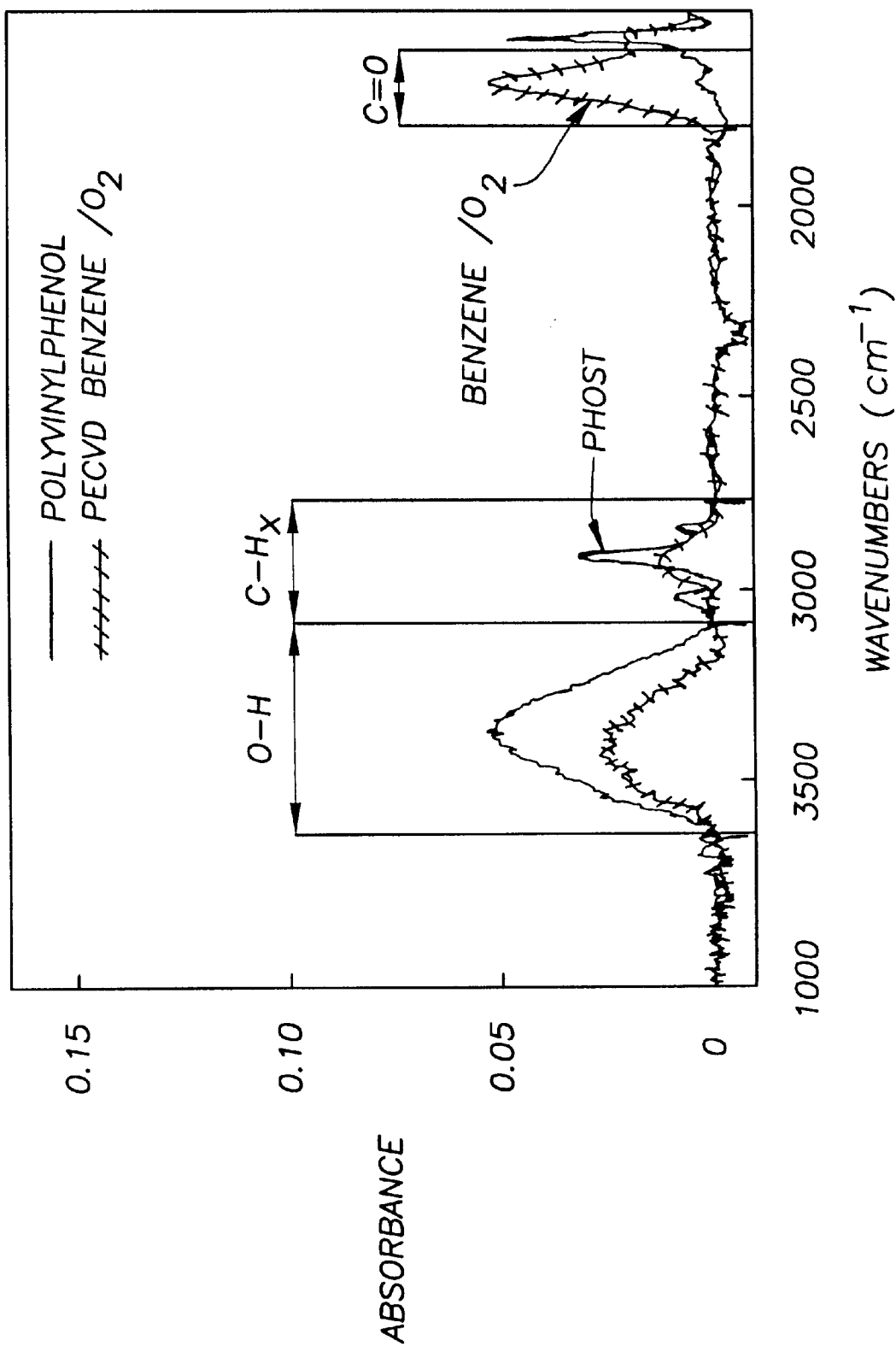
FIG. 2B is a plot of FTIR absorbance for a spin-applied polyvinylphenol film and a polymer film produced in accordance with the invention with the precursors benzene and oxygen.

One performance standard for evaluating PECVD polymer films of the invention is a comparison of a vapor-deposited film's characteristics with that of a standard spin-applied silylation photoresist. FIG. 2B shows the FTIR absorbance spectrum of a film vapor-deposited in accordance with the invention and the FTIR absorbance spectrum of a film of spin-applied polyvinylphenol (PVP), also known as polyhydroxystrene (PHOST) of about 1.0 $\mu$m in thickness. PHOST is accepted as a standard for spin-applied, positive-tone silylation photoresist polymer films.

The vapor-deposited film was produced using benzene and oxygen precursors, at a temperature of about 3° C., a pressure of about 1500 mTorr, an RF power of about 450 W, and an electrode spacing of about 3 cm. The oxygen was introduced to the plasma chamber at a flow rate of about 100 sccm, and the benzene was regulated by the vapor pressure and conductance of the delivery system, as in Example 1 above. With these conditions, a PECVD polymer film of about 1.0 $\mu$m was deposited.

Both the spin-applied polymer film and the PECVD polymer film have a characteristic broad hydroxyl peak centered at around 3400 cm$^{-1}$, and both have an aliphatic C—$H_x$ stretch centered at around 2950 cm$^{-1}$. This indicates that the PECVD process of the invention successfully synthesizes the requisite hydrocarbon and hydroxyl groups that are present in the spin-applied film. Both films exhibit an aromatic-related peak at around 1600 cm$^{-1}$ and also at around 2950 cm$^{-1}$. This aromatic component is desirable for etch resistance in photolithographic patterning steps, as explained in detail later in the discussion. Beyond the expected peak broadening associated with the amorphous nature of the PECVD polymer film, the plasma-deposited film has a carbonyl peak at around 1700 cm$^{-1}$ that is not found in the PHOST film.

Comparing the hydroxyl site density, i.e., the concentration of O—H bonds, in a conventional PHOST photoresist film with that of a PECVD film provided by the invention, it was found that the hydroxyl site density per micron for PHOST, as monitored by the integrated area of the hydroxyl FTIR peak region divided by the film thickness, is about 15–17/$\mu$m. The PECVD films of the invention were found to provide a hydroxyl site density of between about 2/$\mu$m and 20/$\mu$m, depending on the process conditions. As discussed in detail below, for given mechanical film characteristics, e.g., swelling, the higher the density of hydroxyl sites, the higher the silicon density that can be achieved in a silylation photolithographic process. The measured density indicates that the PECVD films of the invention provide the ability to surpass the lithographic performance of PHOST by incorporating a higher density of hydroxyl sites.

EXAMPLE 3

The deposition rate of the PECVD process of the invention is an important factor in considering the process for a production environment. Because a typical plasma deposition chamber accommodates only one substrate at a time, the deposition rate of the process preferably is high enough to be cost effective, and should be at least on the order of about 300 nm/min. The deposition rate of the process was investigated for a number of processing conditions, and in all cases, a rate of at least 300 nm/min was attained.

Considering first the PECVD deposition rate as a function of RF power, three different polymer films were deposited, one based on cyclopentene alone, one based on cyclopentene and oxygen, and the third based on benzene and oxygen. In all three deposition processes, the temperature was held at about 25° C., the pressure was about 900 mTorr, and the gap spacing was about 3.0 cm. For the cyclopentene-based film, cyclopentene was introduced to the plasma chamber at a flow rate of about 200 sccm. For the film produced by reacting cyclopentene with oxygen, the cyclopentene flow rate was about 200 sccm and the oxygen flow rate was about 50 sccm. For the film produced by reacting benzene with oxygen, the oxygen flow rate was about 50 sccm and the benzene flow rate was regulated by the vapor pressure and conductance of the gas delivery system, as in Example 1.

Figure 3A:
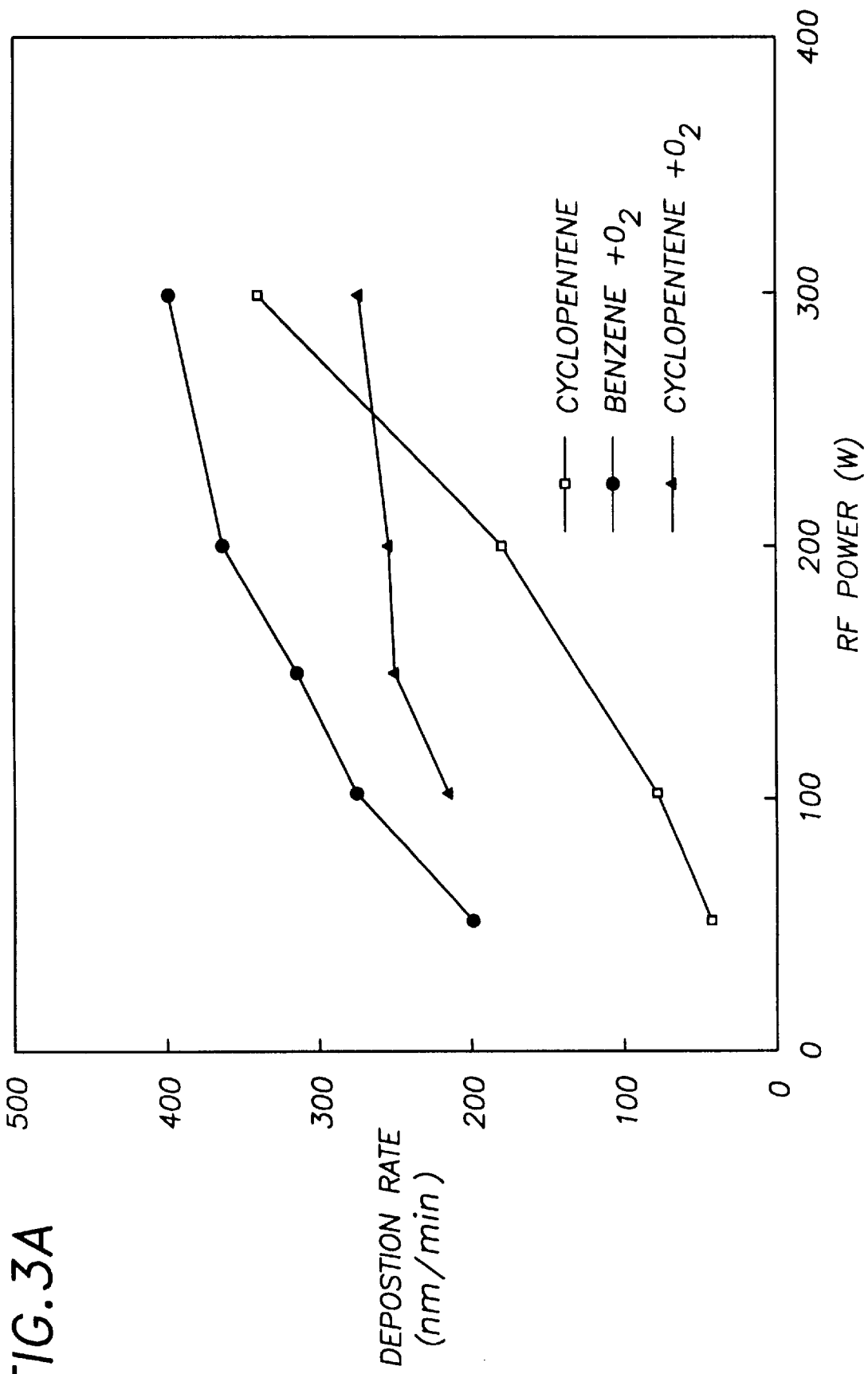
FIG. 3A is a plot of polymer film deposition rate as a function of RF power for three film deposition processes in accordance with the invention; the first employing cyclopentene as a precursor, the second employing cyclopentene and oxygen as precursors, and the third employing benzene and oxygen as precursors.

FIG. 3A plots the deposition rate for the three polymer films as a function of RF power. Generally, the deposition rate increased as the RF power was increased. Note, however, that for the film using cyclopentene and oxygen precursors, the deposition rate was much less affected by an increase in RF power. This indicates a stable region of deposition conditions, at a deposition rate just under 300 nm/min.

Considering the PECVD deposition rate as a function of deposition chamber pressure, two different polymer films were deposited, one based on a cyclopentene precursor, and the other based on benzene and oxygen precursors. In both deposition processes, the temperature was held at about 25° C. and the power was held at about 200 W RF. The gap spacing of the electrodes was at about 3.0 cm. For the film produced with cyclopentene, the cyclopentene was introduced to the chamber at about 200 sccm; for the film produced by reacting benzene and oxygen, the benzene flow rate was regulated by the gas delivery system, as in Example 1, and the oxygen at about 50 sccm.

Figure 3B:
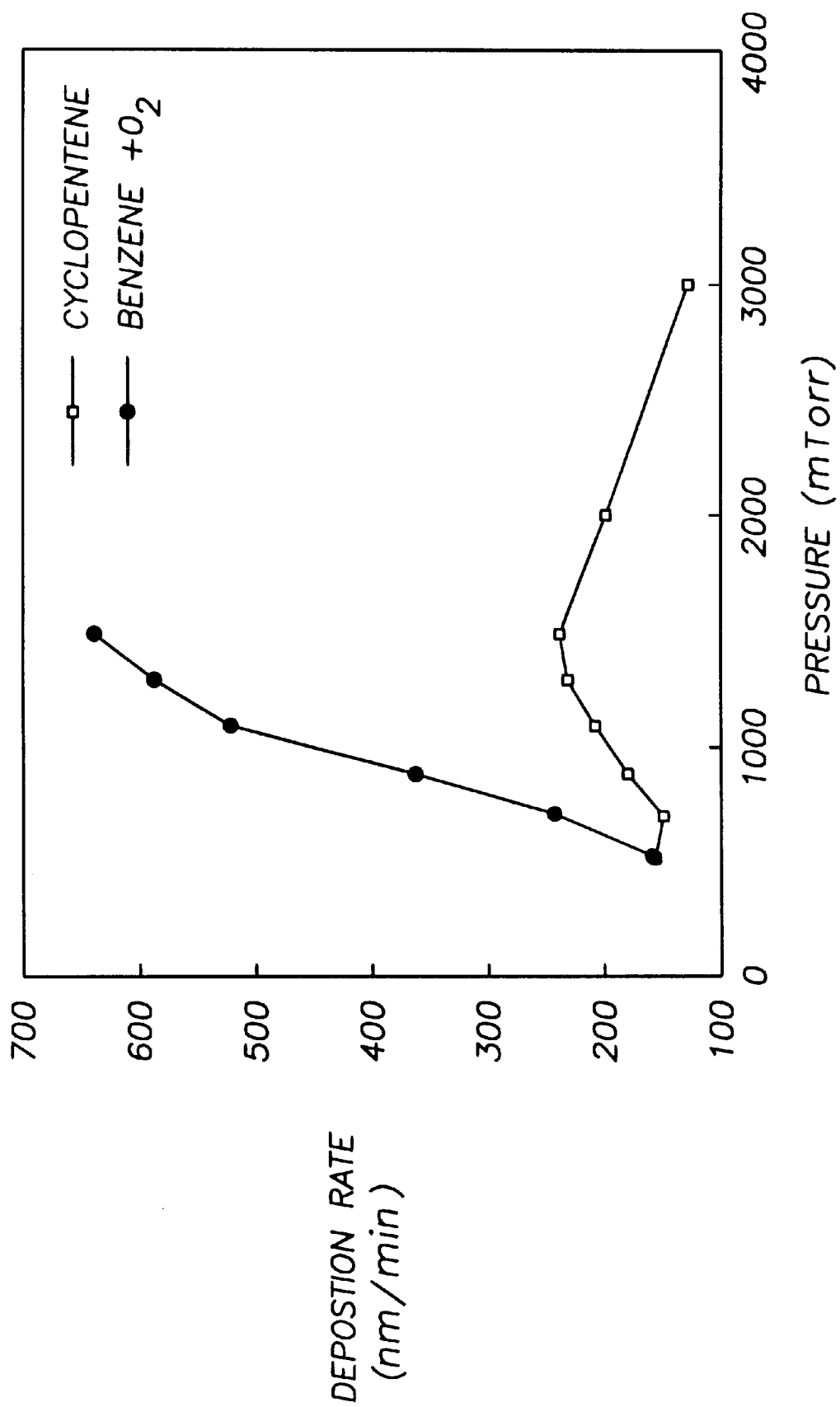
FIG. 3B is a plot of polymer film deposition rate as a function of pressure for two film deposition processes in accordance with the invention; the first employing cyclopentene as a precursor and the second employing benzene and oxygen as precursors.

FIG. 3B plots the deposition rate for the two polymer films as a function of pressure. For the cyclopentene-based process, a stable polymer film was deposited at pressures between about 30–3000 mTorr, with a peak in deposition rate at about 1500 mTorr of about 230 nm/min. For the benzene-oxygen-based process, the deposition rate was found to increase dramatically with pressure up to about 1500 mTorr. At higher pressures, gas-phase polymerization of the precursors took place.

EXAMPLE 4

The ratio of hydroxyl bonds to hydrocarbon bonds synthesized in the PECVD process of the invention determines the relative concentration of sites available for silylation in the deposited film during a silylation photolithographic process. The ratio of O—H bonds to C—H$_x$ bonds as a function of precursor ratios was investigated by depositing three different films each employing the same benzene flow rate and a different oxygen flow rate. The oxygen was provided in a gas consisting of about 92% oxygen and about 8% CF$_4$. The benzene flow rate was regulated by the vapor pressure and conductance of the gas delivery system. The process temperature was about 42° C., the pressure was maintained at about 900 mTorr, and RF power was held at about 150 W, and the electrode gap spacing was set at about 3.0 cm. The oxygen flow rate was about 25 sccm for the first process, about 50 sccm for the second process, and about 100 sccm for the third process.

Figure 4:
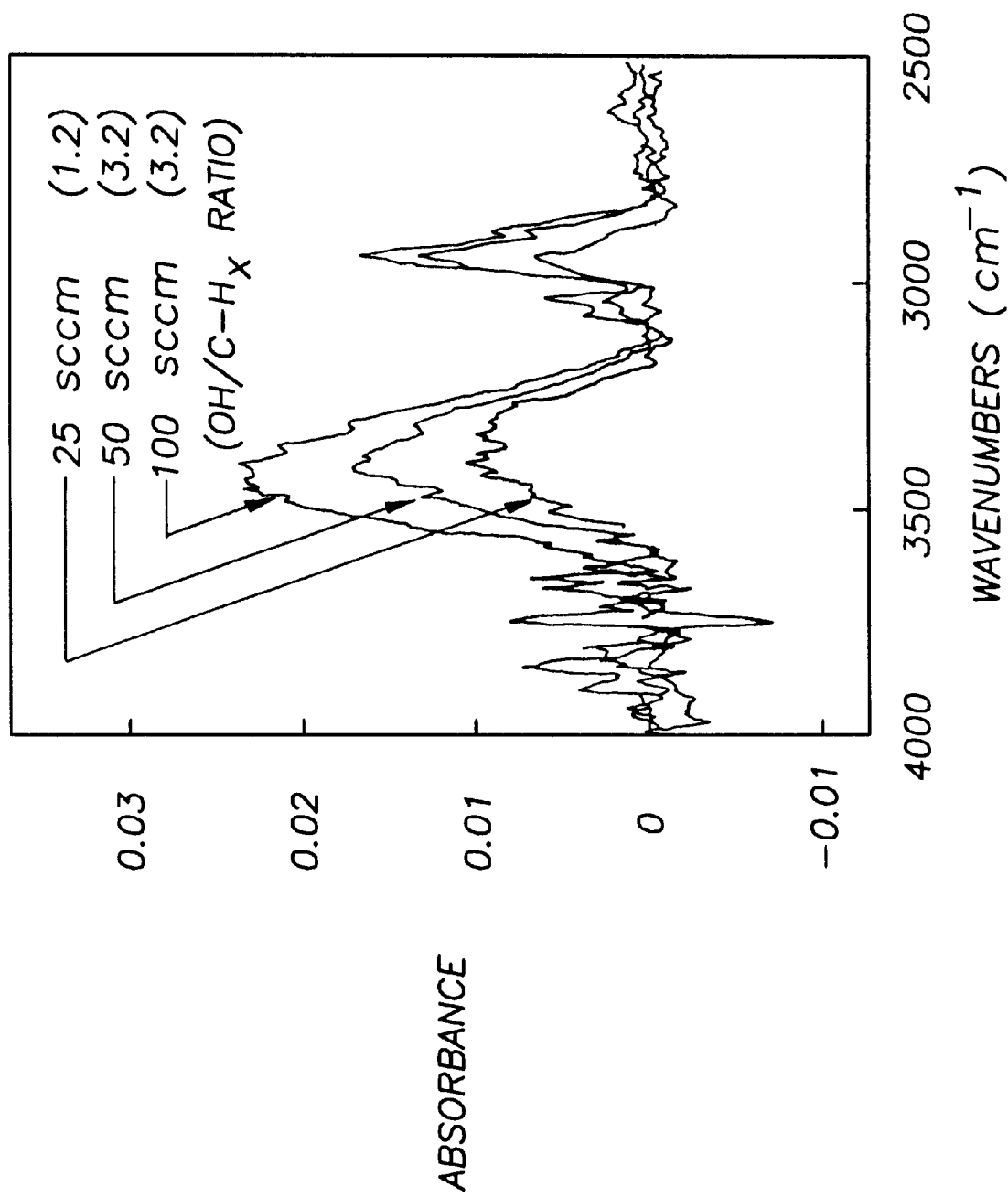
FIG. 4 is a plot of FTIR absorbance for three polymer films produced in accordance with the invention; the first deposition process employing benzene and 25 sccm oxygen as precursors, the second deposition process employing benzene and 50 scem oxygen as precursors, and the third deposition process employing benzene and 100 sccm oxygen as precursors.

FIG. 4 plots the FTIR absorbance spectrum for the three resulting films. As shown in the plot, the ratio of O—H to C—H$_x$ bonds increased as the ratio of oxygen to benzene precursor was increased. This indicates that the PECVD process of the invention can be tailored to achieve a specifically-desired density of hydroxyl bonds for a given film application such as silylation photolithography.

EXAMPLE 5

Figure 5:
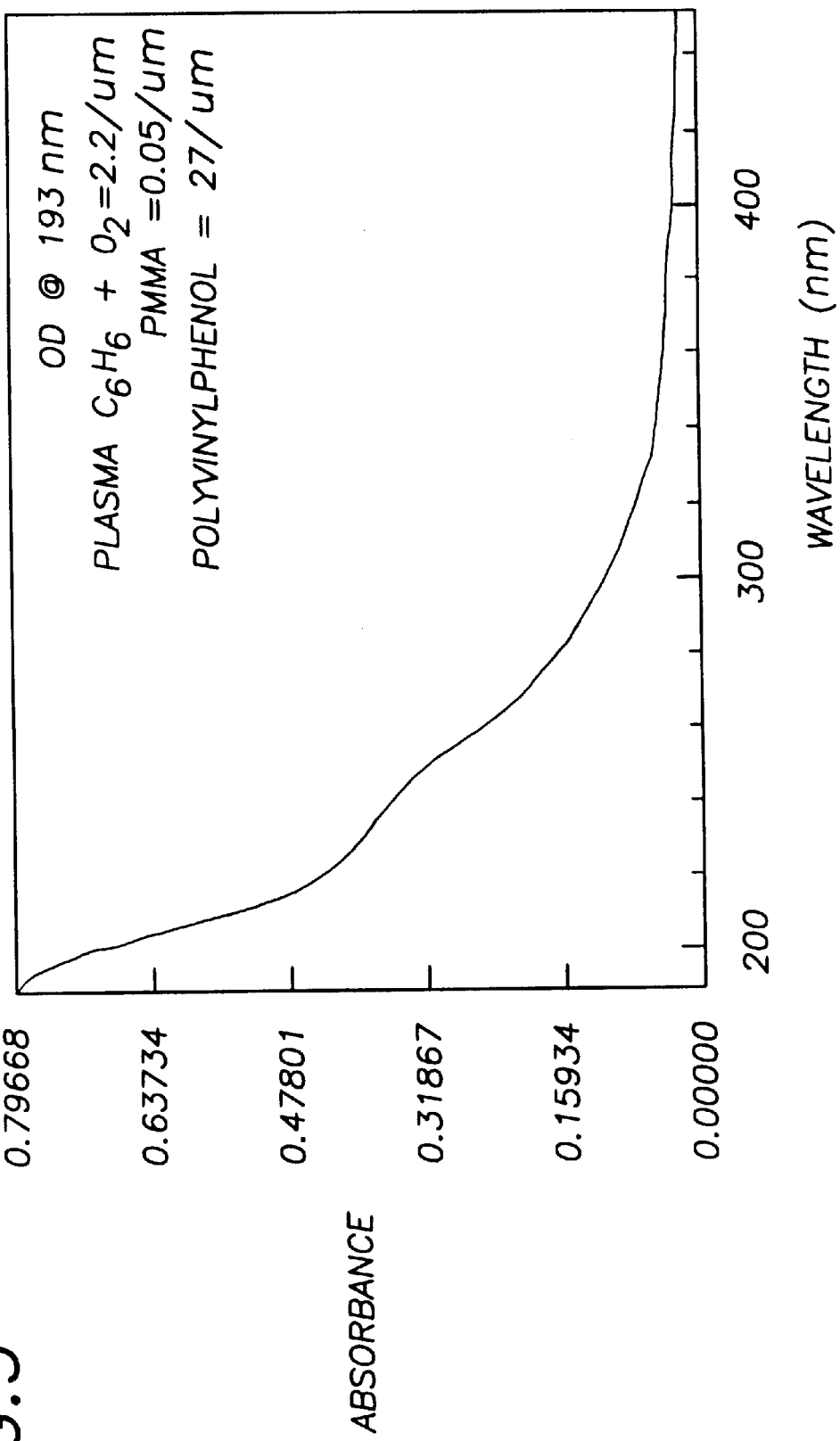
FIG. 5 is a plot of UV—VIS absorbance for a vapor-deposited film provided by the invention employing oxygen and $C_6H_6$ as precursors, with the OD of a spin-applied PMMA film and spin-applied PHOST film given as a reference.

In a silylation photolithography application, a PECVD film produced in accordance with the invention preferably exhibits an absorbance level of UV and visible wavelengths of light comparable with that of conventional spin-applied photoresists. FIG. 5 plots the absorbance of a PECVD film as a function of wavelength. The film was deposited using benzene and oxygen precursors, with an oxygen flow rate of about 50 sccm and the benzene flow rate being controlled by the vapor pressure and conductance of the gas delivery system. The two precursors were reacted in a plasma at a temperature of about 35° C., a pressure of about 900 mTorr, and an RF power of about 300 W, to deposit a film of about 350 nm in thickness.

The PECVD film was found to have an optical density of about 2.2/$\mu$m at about 193 nm; this optical density determines the penetration depth of light at the specified wavelength. Note that the optical density of a conventional spin-applied, liquid-developed resist, PMMA, for UV lithography is about 0.05/$\mu$m, while the optical density of a spin-applied silylation-specific resist, polyvinylphenol (PHOST), is about 27 $\mu$m. The PECVD benzene/oxygen film of the invention provides an optical density less than that of PHOST, but far superior to that of conventional spin-applied, liquid-developed photoresists. The optical density of the PECVD film, being less than that of PHOST, may in fact be desirable for some applications for confining the diffusion profile of a silylation agent in a silylation photolithographic application, as described in detail below.

EXAMPLE 6

The effect of temperature on mechanical properties of a polymer photoresist film is a critical consideration for photolithographic applications. One indication of this effect is the so-called glass transition temperature, $T_g$, of a film, which signifies the softening temperature of that film. This softening temperature is an important characteristic for photoresist films; a photoresist layer having a low softening temperature may flow during lithographic pattern transfer or even during subsequent fabrication processes after the photoresist is patterned.

The glass transition temperature for PECVD films provided by the invention was determined for three different films, all based on benzene-oxygen precursors, as a function of RF power during the deposition process. For all three film depositions, the pressure was maintained at about 1500 mTorr, the temperature held at about 35° C., and the electrode gap spacing was set at about 3.0 cm. The oxygen precursor flow rate for the three film depositions was maintained at about 100 sccm and the benzene flow rate was regulated by the vapor pressure and conductance of the gas delivery system. The power level for the first process was maintained at about 100 W and the deposition was carried out for about 1.2 minutes, resulting in a film thickness of about 750 nm; the power level for the second process was maintained at about 200 W and the deposition was carried out for about 1.0 minutes, resulting in a film thickness of about 430 nm, and the power level for the third process was maintained at about 300 W and the process carried out for about 1.0 minutes, resulting in a film thickness of about 430 nm.

Figure 6:
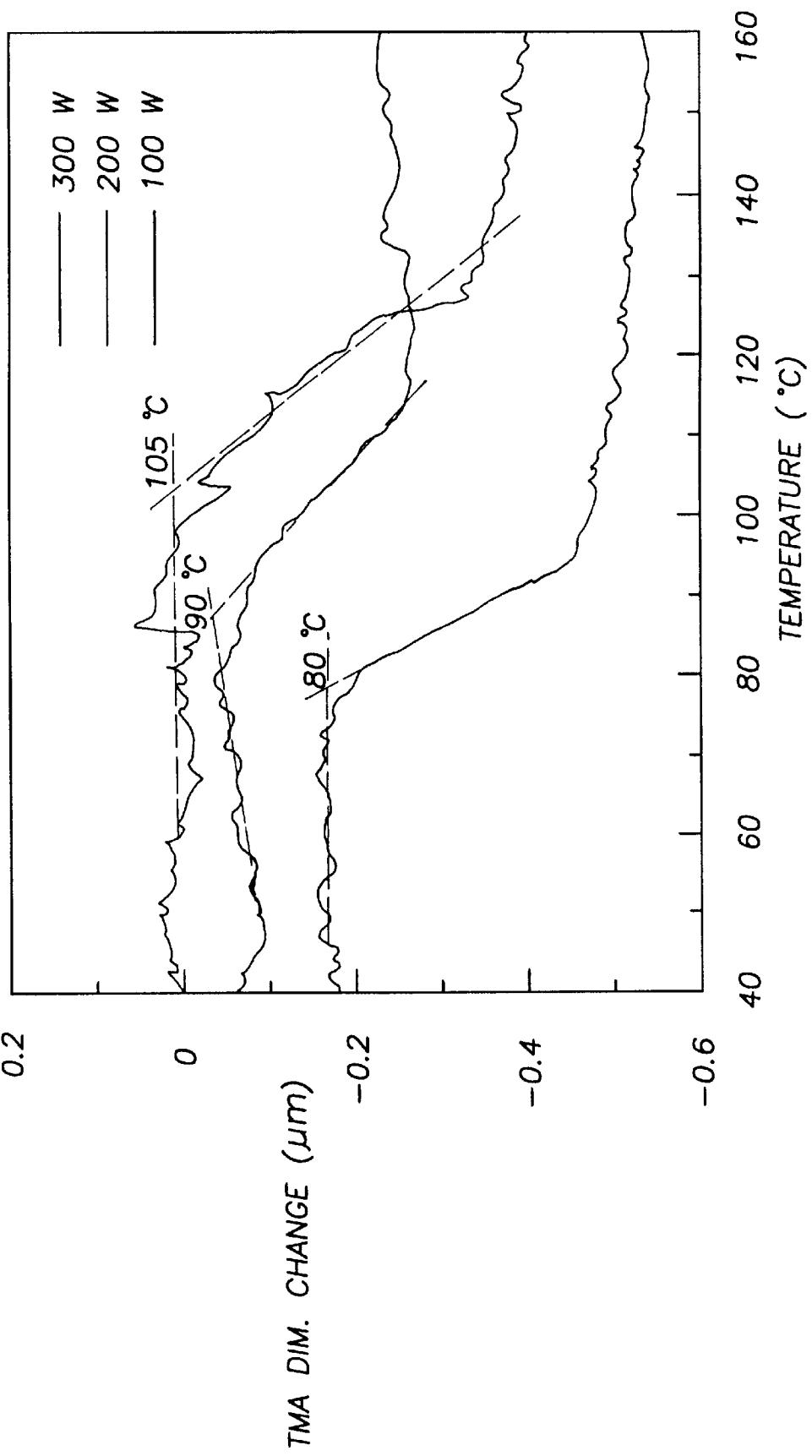
FIG. 6 is a plot of TMA dimensional change as a function of temperature for three films deposited in accordance with the invention; the first film deposited at a process power of 300 W, the second at 200 W, and the third at 100 W.

A commercially-available Thermal-Mechanical Analyzer (TMA) was employed to measure the dimensional change of the deposited films as a function of temperature. FIG. 6 plots this relationship for the 100 W process, the 200 W process, and the 300 W process. The knee in each curve indicates the glass transition temperature for that film. As indicated by the plot, it was found that a higher deposition power resulted in a correspondingly higher glass transition temperature. In general, a higher glass transition temperature indicates a more tightly bound or highly ordered polymer. With these results, it was confirmed that PECVD films provided by the invention can be tailored to withstand a range of processing temperatures and can provide a range of polymer characteristics.

To summarize the various process relationships discussed above, Table 1 below presents a matrix of processing conditions for the PECVD deposition process and corresponding general indications of how those conditions affect the process and resulting characteristics of a homogeneous, single-layer film.

TABLE I

|  | Increasing Oxygen Flow | Increasing Pressure | Increasing RF Power |
|---|---|---|---|
| Deposition Rate: | Decreases | Increases | Little Effect |
| Film Uniformity: | Increases | Increases | Decreases |
| Glass Transition Temp: | Increases | Decreases | Increases |
| Hydroxyl Concentration: | Increases | Little Effect | Little Effect |
| Lithographic Sensitivity: | Decreases | Little Effect | Little Effect |

FIG. 7 schematically illustrates an exemplary photolithographic process employing a PECVD film provided by the invention for use as a positive-tone silylation photoresist. As mentioned previously, the in situ chemical synthesis of film constituents during the PECVD process provides the ability to tailor the concentration and distribution of specific constituents; conventional spin-applied photoresist processes are limited by the initial, typically homogeneous nature of the liquid polymer used to apply the film. Equally importantly, the PECVD process enables deposition of a photoresist film on fabrication substrates of non-standard sizes and shapes that do not facilitate a spin-coating procedure.

PECVD photoresist films provided by the invention also have significant advantages over PECVD bi-layer photoresist schemes in that only one deposition step is required of the PECVD process of the invention, while a typical bi-layer process requires two distinct deposition steps. In addition, only one hydrocarbon precursor is required for the PECVD process of the invention, while a typical bi-layer process requires two different precursors. Perhaps more importantly, a PECVD silylation photoresist requires only one development and patterning process, while the bi-layer process requires a separate development and patterning process for each of the photoresist layers, and requires the use of halogen-based chemistries, which due to their corrosive nature, are undesirable for both safety and process reproducibility considerations.

Figure 7A:
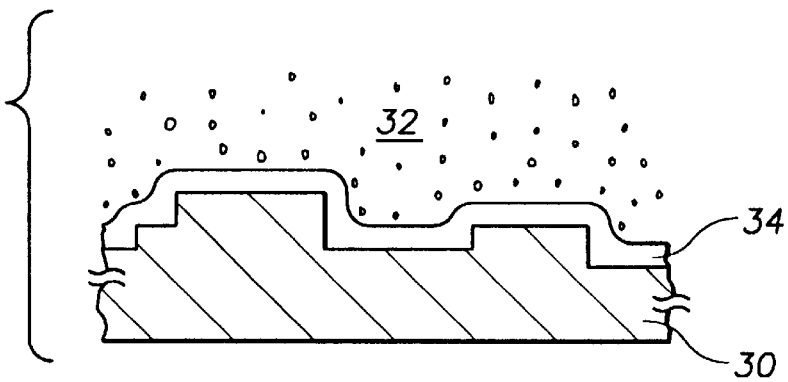
FIGS. 7A–7D are schematic cross-sectional side views of a positive-tone silylation photolithographic process employing a polymer film in accordance with the invention.

In a positive-tone silylation photolithography process in accordance with the invention, a substrate 30, as shown in FIG. 7A, and which may include topology of varying extent, is subjected to a plasma deposition process in accordance with the description above to produce a PECVD silylation photoresist film on the substrate surface. Selected one or more precursors 32, e.g., benzene and oxygen, are introduced in the PECVD process to produce a silylation photoresist that includes hydroxyl groups for absorption of silicon in a subsequent silylation step. The resulting positive-tone silylation photoresist layer 34 is preferably of sufficient thickness to cover the surface topology and withstand subsequent processing steps, but thin enough to permit patterning of submicron-scale features. Various specific photoresist film constituent profiles, e.g., a planarizing profile as shown in FIG. 7B, will be described and explained in more detail below.

The PECVD photoresist film can be employed in a standard silylation photolithographic process as is conventional for spin-applied silylation photoresist films. This is especially advantageous as no specialized processing steps are required to employ the PECVD film; the PECVD process of the invention is thus entirely compatible with standard and well-established silylation photolithographic techniques. Example positive-tone silylation photolithographic processes are described by Hartney in U.S. Pat. No. 5,139,925, issued Aug. 18, 1992; U.S. Pat. No. 5,318,870, issued Jun. 7, 1994; and U.S. Pat. No. 5,362,606, issued Nov. 8, 1994; each of which are hereby incorporated by reference in their entirety. These patents describe silylation-based photolithography processes employing spin-applied silylation photoresist films but that also could employ the PECVD silylation photoresist film of the invention.

Figure 7B:
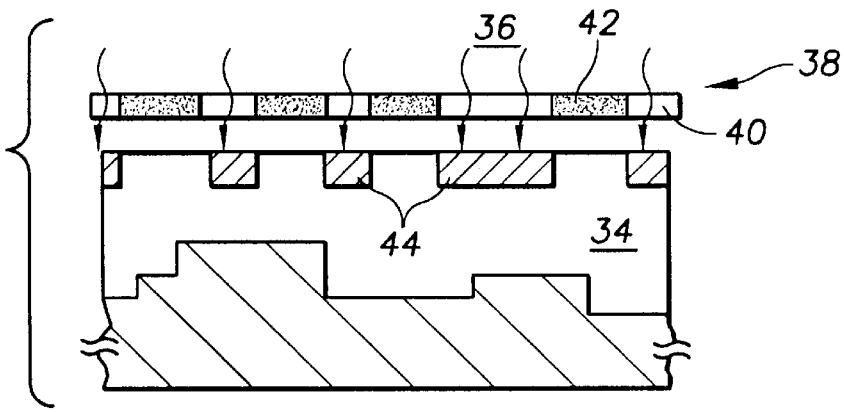

In a standard silylation photolithographic process employing the PECVD silylation photoresist of the invention, a substrate coated with the PECVD film, as shown in FIG. 7B, is exposed to patterned high-energy radiation 36. Such radiation can be supplied by a laser, electron beam, ion beam, or other suitable radiation source. Focused-beam sources can be employed to directly "write" a desired pattern on the photoresist film, while broad-beam sources can be employed to project a broad radiation exposure field through an optical mask 38 including a pattern of transparent areas 40 and opaque areas 42 situated to form a desired pattern. A typical mask for optical lithography is formed, e.g., of a quartz plate on which chrome is patterned using an electron beam source and conventional, spin-applied photoresist. A stencil mask can be used for projection lithography employing an e-beam or ion-beam.

Projection of the radiation through a mask results in photooxidation and crosslinking of regions 44 in the surface area of the photoresist layer 34 that correspond to the transparent areas of the lithography mask through which radiation impinged the photoresist layer. The chemical nature of the crosslinked areas is altered such that diffusion of a silicon-containing silylation reagent is inhibited in those areas.

The exposure radiation is preferably of a wavelength that is substantially absorbed in the upper surface region of the photoresist layer, and is preferably applied in a total dose sufficient to crosslink exposed surface regions to a degree that is effective in preventing silicon up-take in those regions during a subsequent silylation step. For example, silylation photolithography can employ 193 nm radiation. An excimer laser, e.g., a Lambda Physik Argon Fluoride excimer laser, has been successfully employed to provide exposure of such radiation. Particularly good results have also been obtained using a modified GCA 193 nm stepper having a line-narrowed 193 nm excimer laser beam, with a numerical aperture, NA, of about 0.35 and about a 1 cm-diameter exposure field. This tool was found to have a resolution limit of about 0.35 $\mu$m and a flare on the order of about 10–20%. Good results were also obtained using a SVGL Micrascan step-and-scan exposure tool. This tool has a large 22 mm×32.5 mm exposure field, and has been qualified as a prototype production-worthy equipment. This tool provides a resolution limit of less than about 0.2 $\mu$m without phase shifting, or about 0.1 $\mu$m with phase shifting.

As will be recognized by those skilled in the art, a wide range of exposure tools and exposure wavelengths can be successfully employed with the PECVD silylation photoresist of the invention. Indeed, any exposure source that can effectively crosslink or photooxidize silylation photoresist to produce a selective silylation diffusion barrier is contemplated by the invention. For example, radiation at 248 nm, 157 nm, 126 run, 13 nm or other radiation in the EUV range, and conventional short-wavelength X-rays are all candidates for exposure radiation. Radiation at the i-line, i.e., 365 nm, as well as other ranges of radiation are also suitable. Alternate sources, e.g., ion beam, electron beam, or other exposure mechanisms are further contemplated.

Figure 7C:
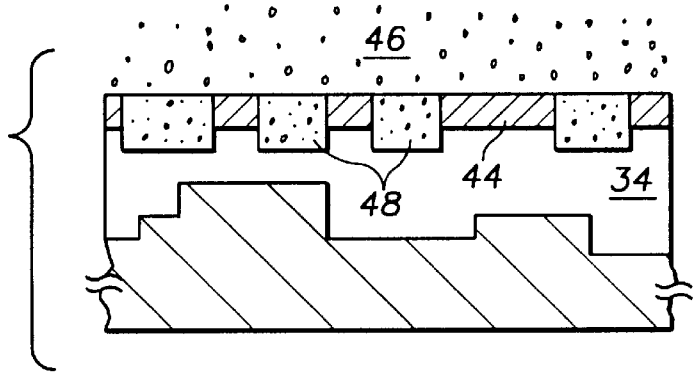

After radiation exposure, the next silylation photolithography step, as shown in FIG. 7C, proceeds with the exposed and crosslinked photoresist 34 subjected to a silicon-containing, silylating gas or liquid reagent 46. The silylating reagent 46 is incorporated into those regions 48 of the photoresist that were not exposed to crosslinking radiation, but does not diffuse into the crosslinked regions 44. The crosslinked regions thereby serve as a diffusion mask to the silylating reagent.

EXAMPLE 7

The total energy dose of radiation to which a silylation photoresist film is exposed in the exposure step determines the diffusivity properties of the crosslinked regions and the corresponding degree of silicon up-take during the silylation process. For a given subsequent pattern transfer process, such as the oxygen plasma etch process described below, there is a threshold of silicon up-take required of the un-crosslinked areas to form an effective mask for the etch process, which preferably etches away only the crosslinked areas. As is well-recognized, this threshold varies depending on the selectivity of a specific pattern transfer process.

The diffusivity properties of a photoresist film in turn effect the photosensitivity of the film. For the PECVD photoresist of the invention, as for all photoresists, photosensitivity is feature and process dependent. For example, for a given exposure, if the minimum radiation energy dose required to produce about 0.5 $\mu$m gratings is found to be about 50 mJ/cm$^2$, then the minimum dose required to produce 0.3 $\mu$m gratings can be expected to be about 60 mJ/cm$^2$, and the minimum dose required to produce isolated lines of about 0.15 $\mu$m width can be expected to be about 70 mJ/cm$^2$.

Explicitly considering the effect of radiation energy dose on silicon incorporation during a silylation process, a PECVD photoresist film produced using CHT and oxygen was exposed to varying doses of 193 nm radiation and then silylated. The deposition process conditions were a pressure of about 300 mTorr, a temperature of about 35° C., an RF power of about 75 W, and electrode gap spacing set at about 3.0 cm. The oxygen flow rate was about 30 sccm and the CHT flow rate was regulated by the vapor pressure and conductance of the gas delivery system, as in Example 1.

Figure 8:
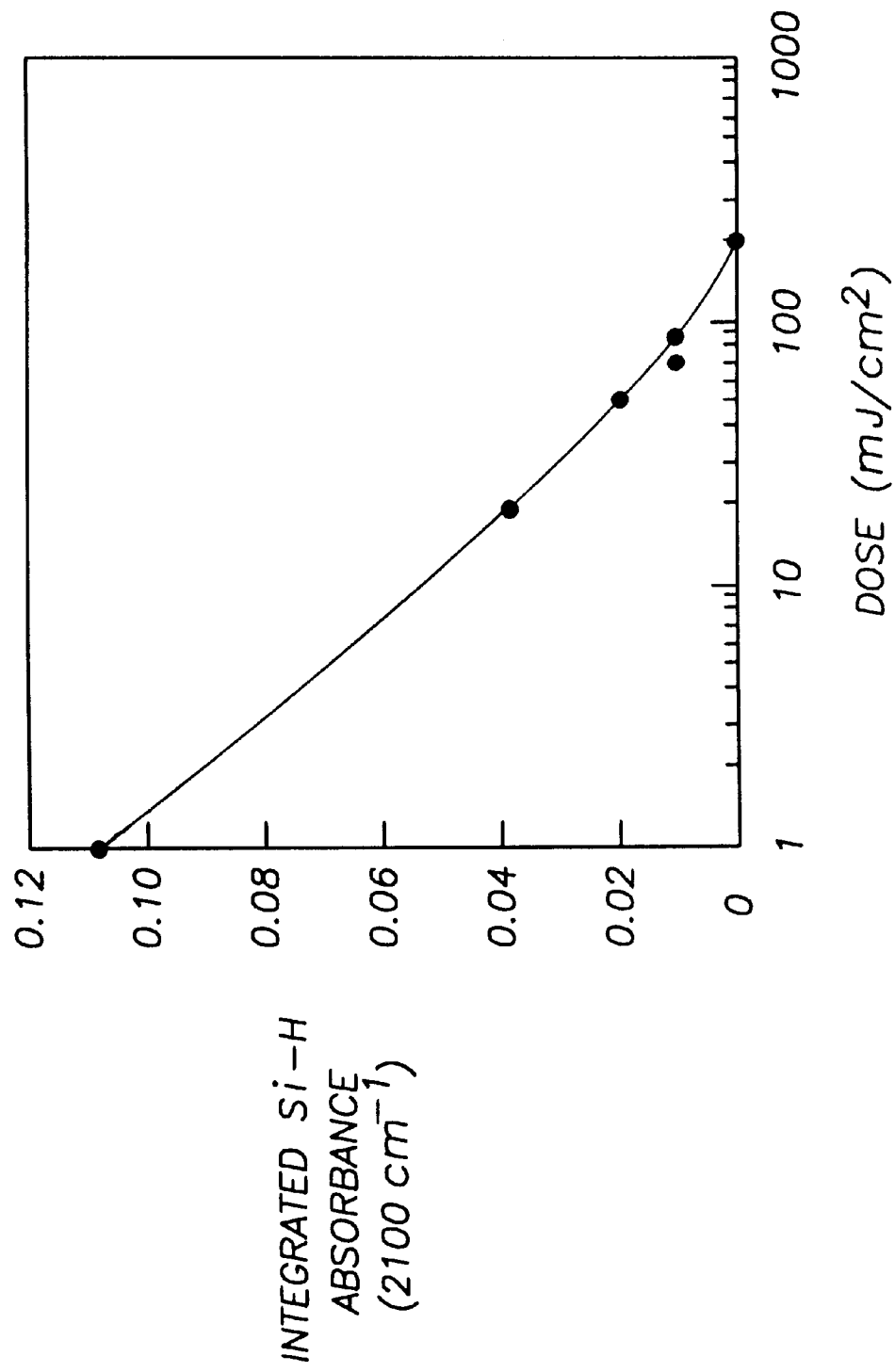
FIG. 8 is a plot of the magnitude of the integrated FTIR Si—H absorbance peak as a function of radiation energy dose for the photolithographic process of FIG. 7.

FIG. 8 plots the magnitude of the integrated Si—H FTIR absorbance peak, at about 2100 cm$^{-1}$, as a function of radiation dose. As shown in the figure, the higher the dose of radiation, the less silicon was incorporated into the film during the silylation process. With this data, one can tailor an exposure dose for a given pattern etch process to produce a desired degree of pattern transfer contrast between the crosslinked and un-crosslinked regions of the photoresist film. The contrast for the silylation process can be defined as the log(silicon incorporation/radiation energy dose). As can be seen from FIG. 8, the contrast for the PECVD silylation photoresist is about 0.3; this contrast level is only slightly less than that of PHOST, the standard spin-applied silylation photoresist. The overall contrast of the PECVD-based silylation process, which can be defined as log(normalized resist thickness remaining/radiation energy dose), as discussed below, is much greater, however, and can be greater than 20.

Turning now to the specifics of the silylating process, in one example of a conventional silylating process, the radiation-exposed PECVD silylation photoresist is exposed to a high vapor pressure, silicon containing gas such as the silylamine vapor dimethylsilyldimethylamine (DMSDMA) at a pressure of about 10 Torr in a computer-controlled silylation chamber, e.g., in a commercially available silylation chamber like the Microstar 200 silylation system from Genesis, Inc., Sunnyvale, Calif.

For PECVD films provided by the invention, silylation with DMSDMA can be accomplished at temperatures between about 25° C. and 140° C., depending on a given film's synthesis conditions. A commercial silylation chamber like the Microstar 200 chamber can enable silylation of the PECVD films at pressures between about 5 Torr and 100 Torr. In a typical silylation process flow, which will be recognized as a conventional silylation process suitable for spin-applied as well as vapor-deposited films, a substrate on which the photoresist is deposited and exposed is first introduced onto a preheated hot plate in the silylation chamber. The temperature of the chamber is then stabilized, and the chamber is evacuated for about 1 minute. At this point, a silylation reagent is introduced to the chamber for a sufficient time, e.g., 1 minute. Then the chamber is evacuated for about 1 minute, purged with, e.g., nitrogen, and then vented to atmosphere.

The absolute silylation rate of the PECVD silylation photoresist films was found to be a strong function of temperature; the films exhibit activation energies for diffusion at greater than about 0.55 eV, which is similar to that reported for DMSDMA in PHOST, the conventional spin-applied silylation photoresist, and ranged up to greater than about 1.0 eV, depending on the specific deposition conditions of a given PECVD film.

As will be recognized by those skilled in the art, many other silylation reagents beyond DMSDMA are suitable. For example, trimethylsilyldimethylamine (TMSDMA), dimethylsilyldiethylamine (DMSDEA), pentamethyldisilyldimethylamine (PMDSDMA), and other such reagents are suitable. PMDSDMA, unlike the other reagents mentioned, provides two silicon molecules that are incorporated at each hydroxyl site when the reagent diffuses into a photoresist film.

In an alternative silylation system, a silylation liquid, rather than vapor, is employed to provide a silicon source for reaction with hydroxyl groups in the silylation photoresist. In such a process, a silylating reagent such as hexamethylcyclotrisilazane (HMCTS) is mixed with solvents such as xylene and propylene-glycol-methyl-ether-acetyl (PGMEA). The resulting solution is then sprayed or puddled onto the photoresist film surface for between about 60–100 s at an elevated temperature, e.g., about 100° C.

Referring again to FIG. 7C, during the silylation process, the silylating reagent diffuses into the un-crosslinked regions of the photoresist surface and chemically reacts with the hydroxyl sites in those regions to form Si—H bonds. The crosslinked regions, however, inhibit this diffusion and preferably do not permit isotropic diffusion of the silylating reagent from the un-crosslinked areas to regions under the crosslinked areas. This diffusion resistance is directly related to the crosslinking depth for a desired silylation depth, which in turn is a function of the optical density of the photoresist at a given radiation exposure wavelength.

Recall that the optical density of a PECVD silylation photoresist provided by the invention was given in FIG. 5 and Example 5 above as about 2.2/μm for 193 nm radiation; at the same wavelength, the optical density of a conventional spin-applied silylation photoresist was given as about 27/μm, and that of a spin-applied non-silylation photoresists was given as about 0.5. Given these characteristics, spin-applied silylation photoresist has been found to produce a crosslinked layer of typically less than about 70 nm in thickness. But the depth of silicon incorporation necessary for successful pattern transfer in the photoresist is typically much greater. As a result, isotropic diffusion of a silylating reagent can occur in conventional spin-applied photoresists, compromising the ultimate lithographic performance for sub-0.25 μm lithography. In contrast, the much lower optical density of the PECVD silylation photoresist of the invention enables a crosslinking layer depth that is sufficiently thick enough to substantially inhibit isotropic diffusion from un-crosslinked depths to regions under the crosslinked areas.

EXAMPLE 8

The reactivity of PECVD silylation photoresist films was investigated by exposing several films all produced using the same deposition conditions to a silylating reagent for a range of times. All of the films were deposited using benzene and oxygen precursors. The deposition processes all employed a temperature of about 35° C., a pressure of about 900 mTorr, an RF power of about 200 W, and an electrode gap spacing of about 3.0 cm. The oxygen flow rate was about 50 sccm and the benzene flow rate was regulated by the vapor pressure and conductance of the gas delivery system. The films all underwent silylation by exposure to DMSDMA at 45° C. at 10 Torr.

Figure 9:
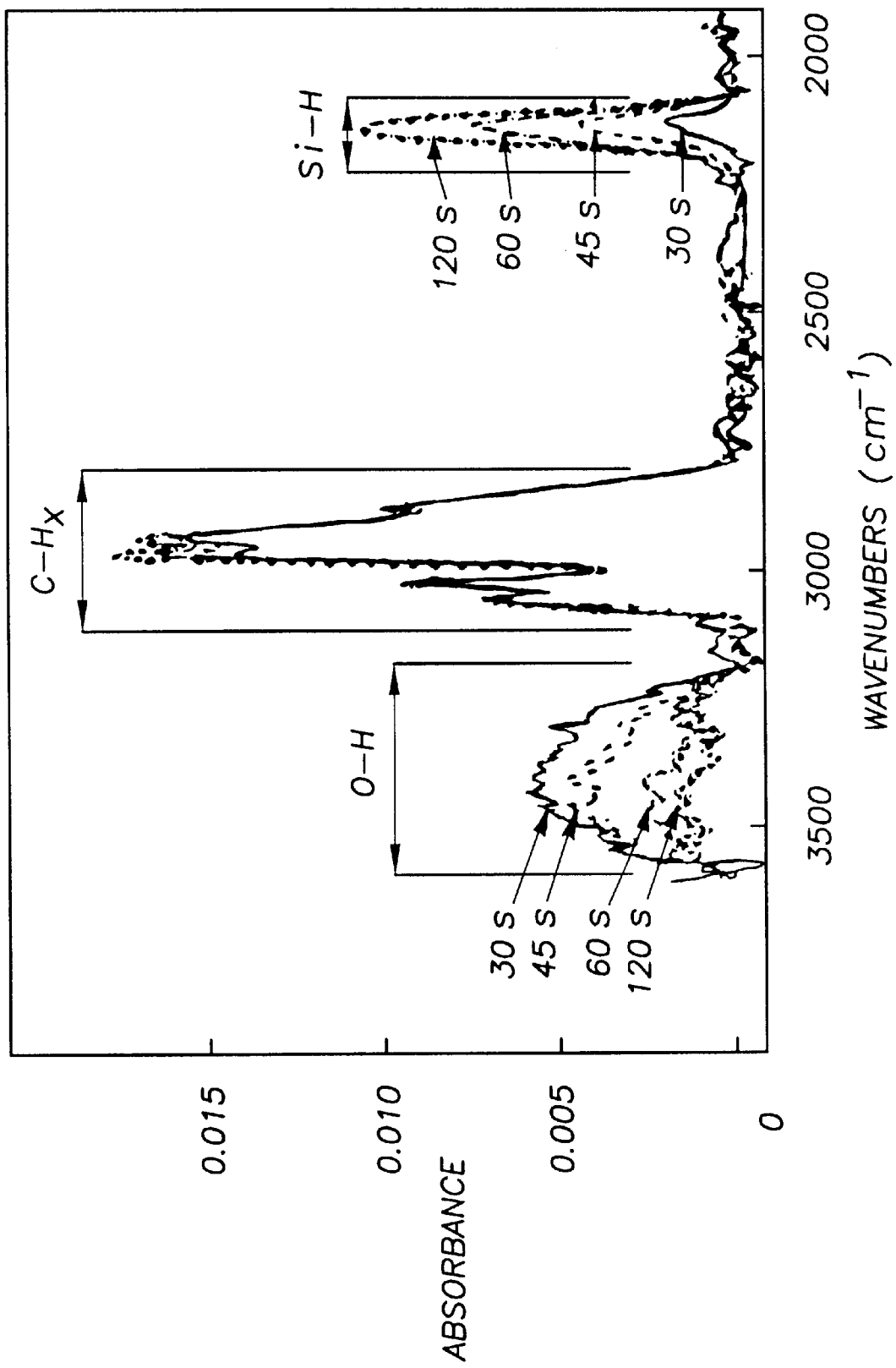
FIG. 9 is a plot of FTIR absorbance for a polymer film provided by the invention at four different silylation exposure times, 30 s, 45 s, 60 s, and 120 s.

FIG. 9 plots the FTIR absorbance spectra of the films as a function of time of exposure to the silylating environment; durations of 30 s, 45 s, 60 s, and 120 s were investigated. As the silylation time was increased, more silicon was incorporated in the films, as indicated by the increase in the magnitude of the Si—H stretch peak at 2185 $cm^{-1}$ and the C—$H_3$ asymmetric stretch peak at 2950 $cm^{-1}$ with longer silylation times. Both of these absorbance peaks are associated with dimethylsilyl group formation. There is also a corresponding decrease in the O—H hydroxyl group peak and an increase in the Si—O—C peak (located at 923 $cm^{-1}$ but not shown) with longer silylation times, indicative of the reaction between the silicon-containing gas and the hydroxyl groups. As can be inferred from the plot, the silylation of the PECVD films proceeds in a linear fashion. This indicates that the PECVD silylation photoresist films produced in accordance with the invention incorporates silicon as effectively and predictably as the more conventional spin-applied silylation photoresists. The linear up-take of silicon with silylation time also indicates a case II diffusion mechanism like that found for PHOST.

Figure 7D:
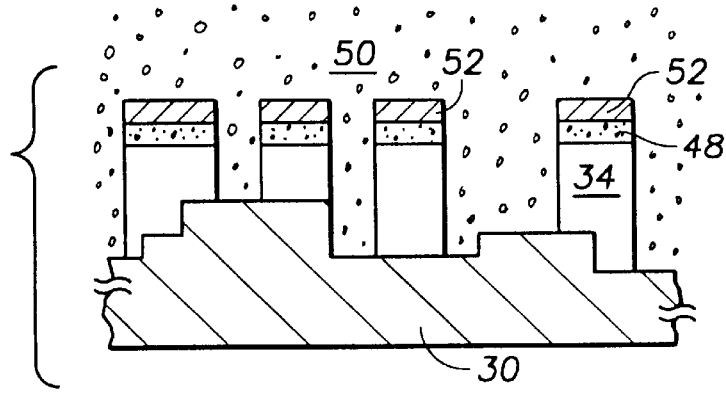

Turning back to the silylation photolithography process, the final photolithography step, as shown in FIG. 7D, consists of pattern transfer. This is accomplished by, e.g., exposing the silylated resist to an oxygen-containing plasma 50 in a conventional reactive ion etching system. The oxygen plasma reacts with the crosslinked regions of the photoresist film that did not incorporate silicon during the silylation process, and etches those regions, whereby they are removed. In contrast, the silylated regions 48 react with the plasma to form a surface oxide layer 52 of $SiO_x$ that acts as an etch barrier. As a result, the silylated photoresist regions are not etched by the plasma and result in a photoresist pattern on the substrate. The patterned photoresist is a positive replication of the opaque pattern of the lithographic mask, or is a negative replication of a direct-write pattern of radiation from, e.g., an electron beam.

Any suitable etching system, e.g., a range of plasma etching systems and plasma chemistries, can be used to accomplish the pattern transfer; as will be recognized by those skilled in the art, a photoresist film can be tailored, to some extent, to a particularly selected etching system. In general, however, only a high-ion-density source can produce etch residue-free, completely anisotropic silylation photoresist patterns using an oxygen plasma alone. One suitable etching system is a Lucas/Signatone high-ion-density helicon plasma etcher, but other less-advanced etchers are equally suitable. Residue-free 0.4 μm sized features in a 0.7 μm-thick CHT/oxygen-based PECVD silylation photoresist layer were successfully patterned using this plasma etcher under conditions of about 100 sccm oxygen gas, a plasma power of about 2000 W, and a substrate chuck power of about 75 W. The pressure was about 2 mTorr and the temperature was about −100° C. Etching for about 80 s yielded about 200% overetch (oxygen plasma).

While this etch process provides optimum etching conditions for pattern transfer of top-surface imaged photoresists, other etching processes are also suitable. Depending on the desired selectivity, the source power can range between, e.g., about 1000 W–2500 W, the chuck power can range between, e.g., about 10 W–200 W, the pressure can range between about 0.5 mTorr–5 mTorr, the temperature can range between about −100° C.–−25° C., and the oxygen flow rate can vary between, e.g., about 10 sccm to 200 sccm.

In other etch process variations, etch species other than oxygen can be incorporated, e.g., $Cl_2$, HBr, $SO_2$, or $N_2$. Aside from a parallel plate etch system, an inductively-coupled plasma system (ICP) or a transformer-coupled plasma system (TCP) can alternatively be employed. The etch selectivity can be quite high in a conventional reactive ion etch system (RIE), but typically results in residue or undercutting of the $SiO_x$ masking layer. However, photoresist screening can be satisfactorily accomplished using a conventional parallel plate RIE reactor because etch residue and profile anisotropy are not factors in such an open field patterning process. It was found that etch selectivity between silylated and unsilylated photoresist regions is usually higher in an RIE reactor, compared with other etch systems, because in an RIE reactor, the etch rate of the silylated resists is proportionately much lower than in other etch systems. However, if speed of single-wafer processing is a concern for a production environment, then an advanced RIE system is required; etch rates of unsilylated resist of about 1 μm/min can be achieved in advanced systems.

EXAMPLE 9

The oxygen plasma etch rate for PECVD silylation films produced in accordance with the invention was investigated as a function of the density of hydroxyl groups synthesized during the films' depositions. Here three films were deposited, all using a CHT precursor and an oxygen gas precursor. The pressure for all three depositions was maintained at about 300 mTorr, the temperature was maintained at about 35° C., and the RF power was maintained at about 75 W. For all three depositions, the CHT flow rate was maintained at about 15 sccm. For the first deposition, the oxygen flow rate was about 30 sccm; for the second deposition the oxygen flow rate was about 60 sccm; and for the third deposition the oxygen flow rate was about 90 sccm. All films were silylated using a vapor DMSDMA process at about 10 T and about 55° C. for about 10 minutes to produce a thick silylated layer. The films were then all etched in the Helicon oxygen plasma etch system described above, with about a 2000 W source, about 75 W substrate chuck, with an oxygen flow rate of about 100 sccm at a pressure of about 2 mTorr and a temperature of about −100° C.

Figure 10:
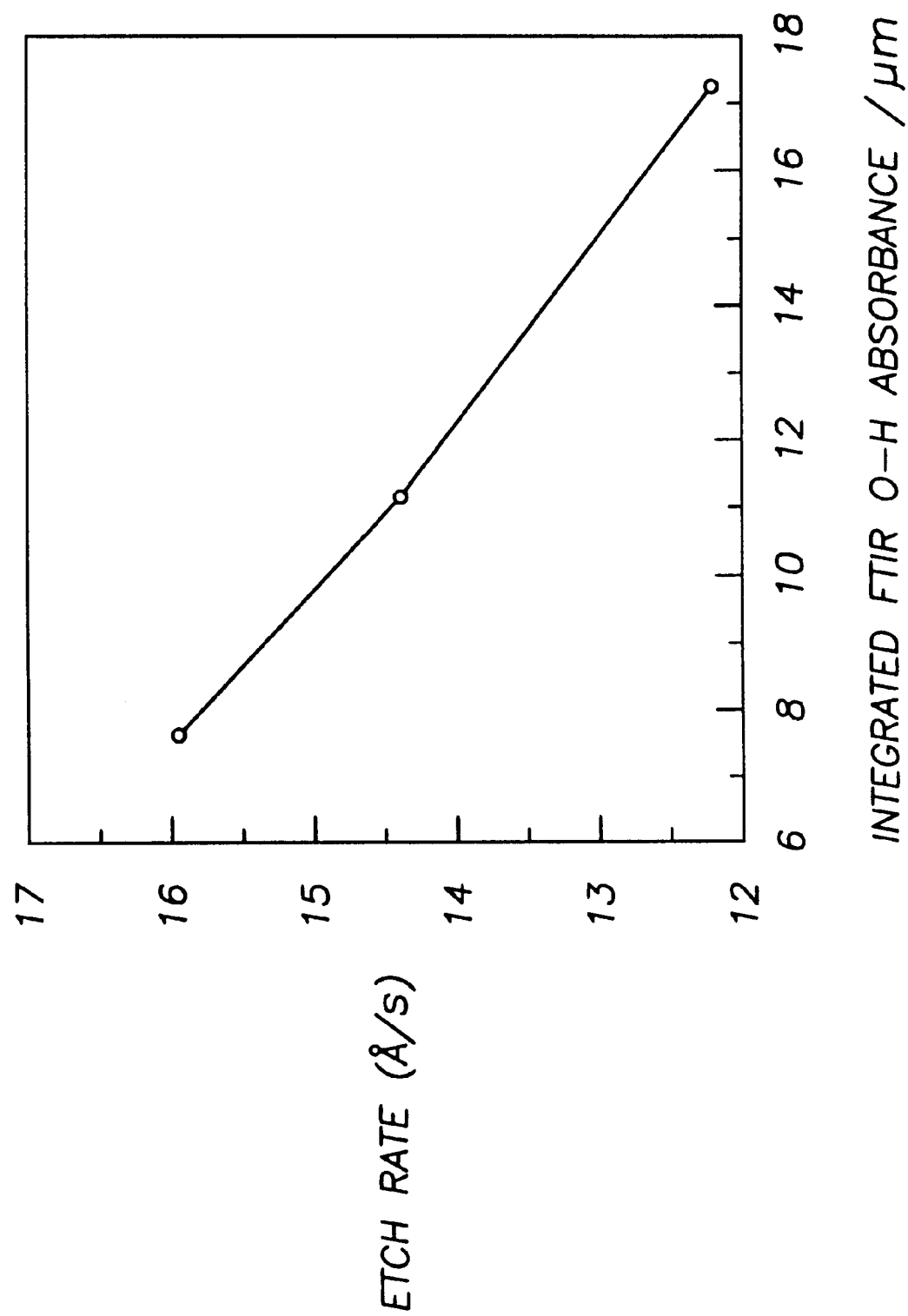
FIG. 10 is a plot of etch rate in a high-ion-density oxygen as a function of FTIR O—H absorbance peak for a fully-silylated positive-tone silylation photoresist provided by the invention.

FIG. 10 plots the etch rate of the PECVD films as a function of the integrated FTIR absorbance spectrum magnitude for the O—H hydroxyl group peak. A clear decrease in etch rate of silylated regions was found for the higher silylation site densities, which correspond to a higher degree of silicon incorporation per unit volume. This relationship provides the ability to tailor the PECVD process conditions for a specifically desired selectivity and thus, specific depth-of-focus and exposure latitude considerations in a given silylation photolithographic process. Thus, the PECVD process of the invention was found to successfully enable prediction and purposeful design of the pattern transfer process.

EXAMPLE 10

For a given PECVD deposition process, various radiation exposure energy doses and silylation times were investigated to determine their combined effect on exposure latitude for a given pattern transfer process. Exposure latitude is here meant as the range in radiation energy dose that, for a given pattern transfer process, results in no more than a ±10% change in the linewidth that can be successfully patterned. Here the PECVD films were deposited by reacting CHT with oxygen. The flow rate of oxygen was maintained at about 90 sccm and the flow rate of CHT was maintained at about 15 sccm. During the deposition process, the power was maintained at about 75 W, the pressure was held at about 300 mTorr, and the temperature was held at about 35° C. The electrode gap spacing was set at about 3.0 cm.

This process resulted in films having a hydroxyl group concentration of about 15/μm. Three different silylation times, 90 s, 105 s, and 120 s, were investigated for a DMSDMA vapor silylation process at about 10 T and about 55° C. The three films were then all etched in an RIE system at a pressure of about 20 mTorr, a power of about −200 V (25 W), at a temperature of about 30° C. and an oxygen flow rate of about 20 sccm. A pattern of about 0.75 μm gratings was used as the mask pattern to be replicated in the three films, the patterns being exposed using a modified GCA stepper at about 193 nm and having a numerical aperture of about 0.35.

Figure 11:
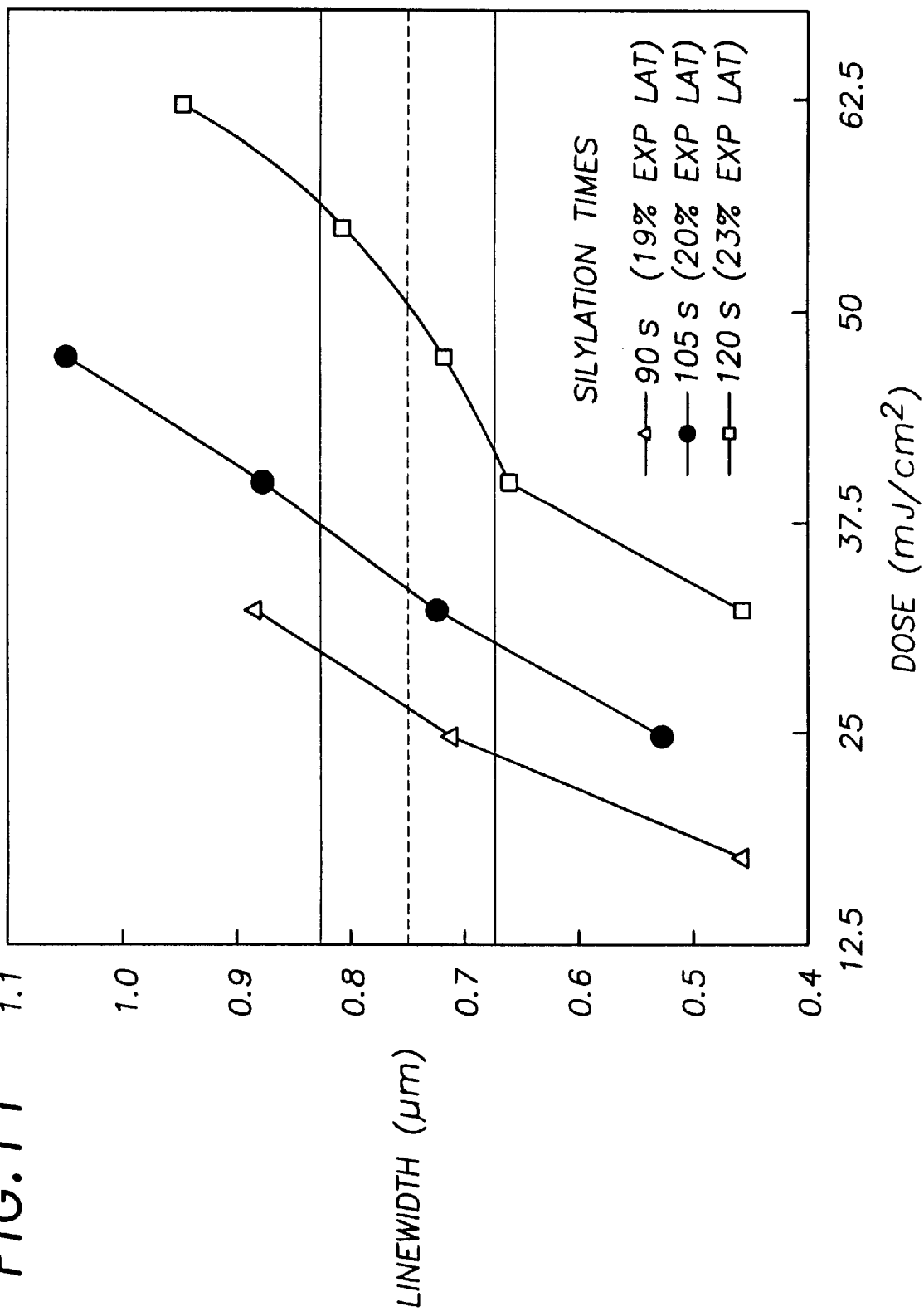
FIG. 11 is a plot of lithographic linewidth as a function of dose for a positive-tone silylation photoresist film provided by the invention and silylated for three different durations, 90 s, 105 s, and 120 s.

FIG. 11 plots the grating linewidth attained in the PECVD film as a function of radiation exposure energy dose for the three different silylation conditions. As the silylation time was increased, more silicon was incorporated in a film, as expected. It was also found that for higher radiation energy exposure doses, larger grating linewidths were produced for a given silylation condition. As can be seen from the plot, the longer silylation times required higher radiation energy doses to effectively inhibit silicon diffusion, during the silylation process, into crosslinked regions of the photoresist film. However, it was found that of the three silylation process durations, the longer durations resulted in improved exposure latitude; the 90 s silylation resulted in about 19% latitude, while the 105 s silylation resulted in about 20% latitude and the 120 s silylation resulted in about 23% latitude. It must be noted though that all three of these processes provide adequate process latitude, indicating that the PECVD deposition process of the invention is robust with regard to various silylation conditions.

Figure 12:
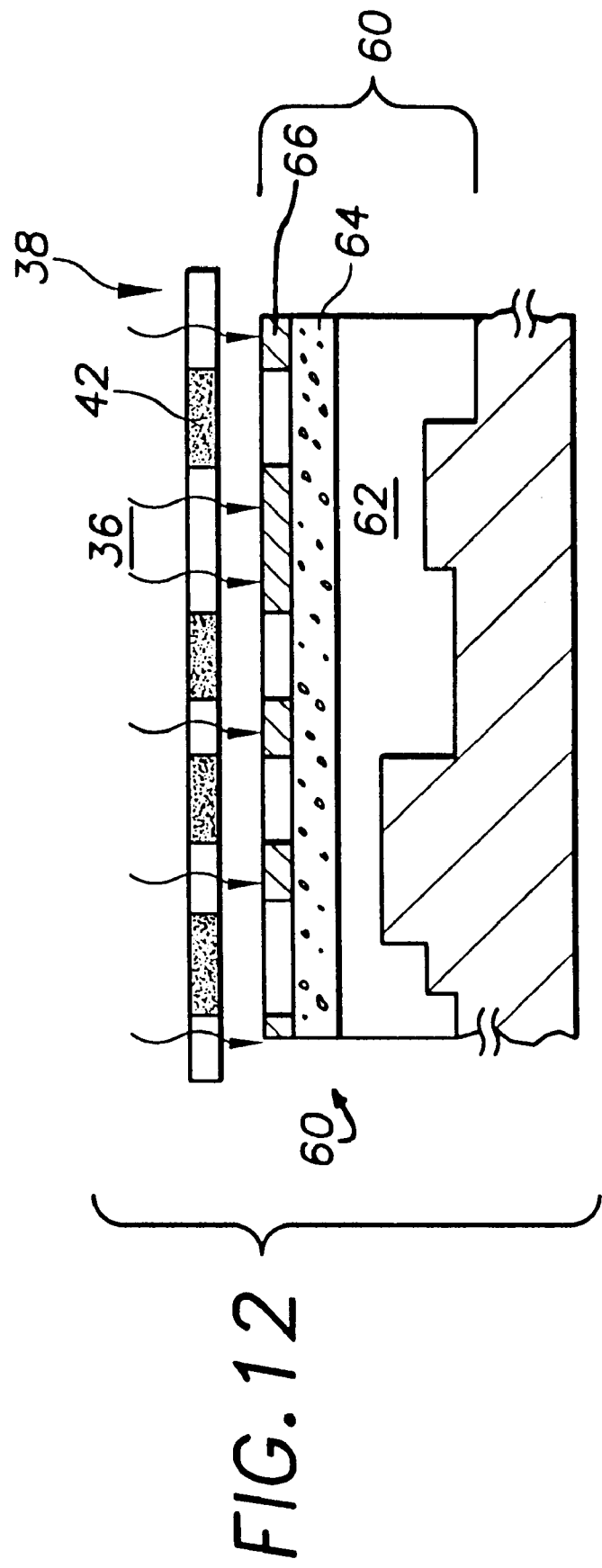
FIG. 12 is a schematic cross section of a continuous three-layer polymer silylation photoresist provided by the invention.

Considering now variations of the PECVD silylation photoresist in accordance with the invention, FIG. 12 illustrates a PECVD silylation photoresist film in which the depth profile of the film is purposefully tailored during the deposition. This is achieved by exploiting the custom in situ chemical synthesis enabled by the PECVD process, and results in the ability to decouple the various properties required of a viable silylation photoresist by providing distinct PECVD film regions that each are optimized for a given property. While this decoupling region scheme is not absolutely required of PECVD photoresist films provided by the invention, it provides much greater latitude in design of the overall lithographic performance of a resist film than a single-layer PECVD film, and is far superior to single layer spin-applied photoresist films.

As shown in FIG. 12, the layered PECVD photoresist film 60 includes three distinct film regions 62, 64, 66. These layer regions can be deposited in sequence during a single deposition process during which various process parameters are controlled over time to enable differing process conditions; or alternatively, each layer region can be deposited in a separate process or even in a separate deposition chamber. In one example multi-region PECVD silylation photoresist film in accordance with the invention, the lower PECVD region 62 is optimized to be chemically and mechanically robust to the specific fabrication processing for which a "resist" pattern is needed. For example, the photoresist pattern may be employed to provide a patterned barrier to a chemical wet etching, plasma etching, ion implantation, metal deposition or lift off, or other fabrication step. The middle PECVD region 64 is optimized as a silylation reaction layer and accordingly is synthesized to include a hydroxyl concentration and profile tailored for a given silylation process. The upper PECVD region 66 is optimized for a desired photosensitivity, contrast, and silylation diffusion profile corresponding to a given photolithographic exposure process.

Considering in detail first the lower region in the layered PECVD photoresist film, the precursors and deposition conditions of the PECVD process can be set for a first time period during the deposition to produce a lower photoresist region that is optimized for planarization properties or etching conditions prescribed to follow a given photolithographic process. For example, the lower film region can be optimized for a dry etching process, which is frequently the etch process employed subsequent to a photolithographic patterning step. There are specific properties of a carbon-based photoresist film that enhance the film's ability to act as a dry etch mask. These are optimized in the lower film region to provide effective masking for even aggressive dry etch chemistries such as fluorine, chlorine, bromine, or other similar plasma etch species used to etch oxide, nitride, silicon, metals, dielectrics, diffusion barriers, silicides, polysilicon, or other fabrication material.

The central criteria for establishing robustness of a photoresist to an aggressive dry etch chemistry is the selectivity the photoresist provides between protected areas underlying the photoresist and unprotected substrate areas. For polymer hydrocarbon-based films, the etch resistance of the film can be improved by enhancement of crosslinking. In conventional spin-applied polymer photoresist films, crosslinking enhancement is typically accomplished by post-photolithographic development processes like elevated heat treatments or intense UV radiation exposure. These processes effect the aromatic or cyclic hydrocarbon groups in the polymer film; for a given concentration of such groups, the processes act to crosslink a larger percentage of hydrocarbon groups than are crosslinked during more conventional processes.

In the invention, crosslinking enhancement is accomplished in the lower PECVD polymer region by synthesizing for that region a cyclic hydrocarbon that is inherently highly crosslinked. For example, the lower polymer region can be synthesized using an all-hydrocarbon precursor, i.e., eliminating an oxygen precursor in the examples discussed above. In one example, the lower PECVD polymer region is synthesized using only a cycloheptatriene precursor. In etching experiments, it was found that the hydrocarbon-only polymer film was much more etch-resistant than a film synthesized using cycloheptatriene and oxygen precursors. Benzene and cyclopentene are examples of other hydrocarbon precursors that could alternatively be employed. In general, the lower etch-resistant layer is preferably formed of any aromatic-based polymer or highly-cyclic compound having little or no oxygen content.

As mentioned above, the lower polymer layer region can be employed as a planarizing layer. In this case, the layer is advantagous in providing, as shown in FIG. 12, a layer for accomodating varying topology of a substrate on which a photolithographic process is to be carried out. Various processing conditions for producing such a planarizing lower region are detailed in U.S. Pat. No. 5,017,403, issued May 21, 1991 to Pang et al., the entirety of which is hereby incorporated by reference.

Preferably, the selected hydrocarbon precursor results in a crosslinked region that is highly thermally stable, as exhibited by, e.g., less than about 5% film loss after a 250° C. hot-plate bake for 90 s, and is of a thickness between, e.g., about 0.5 $\mu$m and 2.0 $\mu$m.

In alternative scenarios in accordance with the invention, a hydrocarbon-based layer is synthesized that is not cyclic but that nevertheless is highly etch resistant. For example, a diamond-like carbon film can be vapor-deposited to provide a lower etch-resistant layer. In an example synthesis process, a methane, at a flow rate of about 9 sccm is reacted with an ethane at a flow rate of about 50 sccm in a deposition process at an RF power of about 400 W, −300 V, self-biased, at room temperature. While non-cyclic polymers in general are characterized by poor etch resistance, these hydrocarbon-based films provide a mechanism for achieving etch resistance without relying on a crosslinking mechanism.

Turning to the middle PECVD photoresist region shown in FIG. 12 at 64, this region is tailored to provide a desired concentration of silylation hydroxyl sites. As discussed previously, in a silylation process, a silylating reagent diffusing into a polymer having hydroxyl sites reacts with the hydroxyl sites to produce Si—O—C—H$_x$ bonds. The density of hydroxyl sites therefore has a direct correlation to the pattern transfer selectivity produced by the silylated sites. A higher density of hydroxyl sites per unit volume of the middle region accordingly results in a higher selectivity in, e.g., an oxygen plasma pattern transfer process.

The per unit volume concentration is also an important consideration because in general, swelling of a silylation photoresist film occurs as silicon is incorporated during a silylation process. Thus, the amount of silicon that can be incorporated per unit volume of the photoresist region depends not only on the hydroxyl concentration but also on the silylation reagent used and the mechanical properties of the region. For example, if a di-silyl silylating reagent is employed, which, as mentioned previously, enables two silicon molecules to incorporate with a single hydroxyl site, then given that all sites are silylated and no swelling of the film occurs, half as many hydroxyl sites would be required as would be needed with a mono-silyl reagent. The PECVD process of the invention provides the ability, as described in the examples above, to incorporate a hydroxyl site concentration of at least about 15/$\mu$m, which is equivalent to or higher than that of conventional spin-applied PHOST.

Preferably, the thickness of the middle silylation layer is set equal to the pattern dimension being resolved by a given photolithographic process. For example, a 200 nm silylation layer is preferable for resolving 0.2 $\mu$m features. Further, the thickness depends on the silicon density expected to be achieved in a silylation process The upper PECVD polymer photoresist region, 66 in FIG. 12, is optimized to provide high contrast between surface regions through which a silylating reagent can diffuse and those surface regions presenting a diffusion barrier to the silylating reagent. In the invention, this region is synthesized as a relatively thin layer that it is especially photosensitive to photocrosslinking or photooxidation by high energy radiation. Such photocrosslinking and photooxidation of this surface layer is the mechanism by which permeability to silylating silicon-containing gases is reduced. Experimentally it is known that such optical processes are dramatically increased at shorter radiation exposure wavelengths.

Preferably, the upper photoresist layer is characterized by a lower hydroxyl site concentration than the middle silylation layer and by a higher degree of dissociated monomers.

This results in a higher photoreaction efficiency, i.e., quantum yield, for the upper layer. Furthermore, the upper layer preferably promotes diffusion and reaction into the middle layer at unexposed regions and inhibits diffusion in exposed regions, for a positive-tone photoresist and a given set of silylation conditions.

EXAMPLE 11

The three-region PECVD carbon-based film of FIG. 12 was synthesized in one vapor deposition procedure and processed using standard silylation photolithographic techniques to pattern sub 0.25 $\mu$m features including isolated lines, gratings, and octagons. A 4-inch silicon substrate was employed for the processing. The PECVD polymer film was deposited by first introducing CHT at a flow rate of about 12.5 sccm. Vapor deposition was initiated with an RF power of about 200 W, a pressure of about 50 mTorr, a temperature of about 25° C., and an electrode gap spacing of about 3.0 cm. The deposition was conducted for about 4 minutes to produce an etch-resistant film of about 0.8 $\mu$m in thickness.

A middle PECVD region with high hydroxyl concentration was then deposited without interruption of vacuum. This was achieved by changing the CHT flow rate to about 15 sccm and adding an oxygen flow rate of about 45 sccm. The pressure was increased to about 600 mTorr and the power was maintained at about 200 W. These process conditions were maintained for about 8 minutes to produce a middle region of about 200 nm in thickness.

At this point, a thin upper photosensitive PECVD polymer region was immediately deposited by reducing the power to about 100 W and reducing the oxygen flow rate to about 30 sccm while maintaining the pressure and CHT flow rate for about 0.2 minutes. This produced a layer of about 40 nm in thickness.

After deposition, the PECVD film was exposed to 193 nm radiation on a 0.5 NA Micrascan step-and-scan stepper from SVGL. Twenty five fields were exposed at doses ranging from about 10 mJ/cm$^2$ to about 200 mJ/cm$^2$. After exposure, the substrate was introduced into a commercially-available Genesis Microstar silylation machine. The substrate was exposed to DMSDMA vapor at about 10 Torr and about 55° C. for 60 s. The substrate was then exposed to a high-ion-density oxygen plasma for pattern transfer. The substrate was etched in process conditions of about 100 sccm of oxygen at about 2500 W of RF power in the source, about 75 W of RF power on the wafer chuck, at a temperature of about -100° C. The etching was conducted for about 50 s, resulting in about 20% overetch as monitored in situ with a full-wafer interferometer from Low Energy Systems, Inc., of Somerville, Mass. Scanning electron microscopy of the patterns indicated successful patterning of sub 0.25 isolated lines, gratings, and octagons at a dose of between about 100 mJ/cm$^2$ and about 200 mJ/cm$^2$.

EXAMPLE 12

A three-region PECVD silylation photoresist film was deposited on a 4-inch substrate under the process conditions given for that of Example 11. The deposited film was then exposed to an electron beam in a JEOL JBX-5D11 scanning electron beam lithography tool. The silylation photoresist was patterned with various feature linewidths at dose levels ranging between about 50 $\mu$C/cm$^2$ to about 500 $\mu$C/cm$^2$.

After exposure, the substrate was exposed to the silylating reagent DMSDMA, in vapor form, at a pressure of about 10 Torr and a temperature of about 55° C. for about 30 s. The substrate was then etched in a parallel-plate RIE oxygen plasma system, under conditions of 20 sccm oxygen, 65 W RF power, -200 V self-bias, a pressure of about 20 mTorr, and a temperature of about 25° C. The etch was carried out for about 10 minutes. Optical microscopy of the etched film indicated successful patterning of 1 $\mu$m-wide lines at an exposure dose of between about 300 $\mu$C/cm$^2$–500 $\mu$C/cm$^2$. The relatively high exposure dose was required because the upper film region was not specifically engineered for efficient crosslinking by an electron beam; tailoring of the upper film region for specific electron beam illumination can enable a lower effective dose for a given linewidth.

Because the three-layer polymer films of Examples 11 and 12 were produced by a single, uninterrupted deposition process, no interface discontinuities existed between the layers. This is a result unachievable with conventional spin-applied photoresist or even combinations of spin-applied and vapor-deposited photoresist layers. However, as will be recognized by those skilled in the art, the three-layer polymer film can alternatively by synthesized in multiple, separate deposition processes or even in separate deposition chambers. Preferably, the deposition conditions are optimized for a given multi-layer film application.

The strategy of a single deposition process can be extended to an entire silylation photolithographic process in which all processing steps take place in a single chamber environment or so-called cluster of chambers. Such an arrangement enables a photolithographic silylation sequence in which a substrate is maintained in a chamber environment and not exposed to ambient atmosphere between steps. This has particular advantages for substrates that are prone to oxidation or contamination or that do not lend themselves to manual handling. The vapor-deposition process of the invention, by eliminating the need for any spin-coating or liquid-developing photolithographic steps, enables such a closed processing environment.

From the foregoing, it is apparent that the vapor-deposition process and resulting polymer films described above not only provide a superior silylation photoresist film, but enables a degree of custom synthesis not possible with conventional spin-applied films. It is recognized that those skilled in the art may make various modifications and additions to the preferred embodiments described above without departing from the spirit and scope of the present contribution to the art. Accordingly, it is to be understood that the protection sought to be afforded hereby should be deemed to extend to the subject matter of the claims and all equivalents thereof fairly within the scope of the invention.

I claim:

1. A plasma synthesized polymer film disposed on a semiconductor wafer, the film having C—C bonds, C—H bonds, and plasma synthesized O—H bonds, the film having a level of oxygen constituency that is selected to provide a ratio of O—H bond concentration to C—H bond concentration that yields substantially a prespecified concentration of reactive silylation sites in the film.

2. A plasma synthesized polymer film having C—C bonds, C—H bonds, and plasma synthesized O—H bonds, the film having a level of oxygen constituency that is selected to provide a corresponding selected ratio of O—H bond concentration to C—H bond concentration, the O—H bond concentration being distributed through film depth from a relatively higher concentration at shallow depths to a relatively lower concentration at lower depths.

3. A plasma synthesized polymer film having C—C bonds, C—H bonds, and plasma synthesized O—H bonds the film having a level of oxygen constituency that is selected to provide a corresponding selected ratio of O—H bond concentration to C—H bond concentration, the O—H bond concentration being distributed through film depth from a relatively lower concentration at shallow depths to a relatively higher concentration at central depths and substantially zero concentration at lower depths.

4. The film of claim 1 wherein the O—H bond concentration is distributed through the polymer as a function of film depth.

5. The film of claim 1 wherein the O—H bond concentration is homogeneously distributed through depth of the film.

6. The film of claim 1 wherein the semiconductor wafer comprises a silicon wafer.

7. The film of claim 1 wherein the semiconductor wafer includes varying surface topology.

8. The film of claim 7 including a planarizing surface profile over the varying surface topology of the semiconductor wafer.

9. The film of any one of claims 1, 2, or 3 characterized by a permeability to silicon-containing vapor.

10. The film of claim 9 wherein the silicon-containing vapor is characterized by a reactivity with reactive silylation sites in the film.

11. The film of any one of claims 1, 2, or 3 characterized by a tendency to crosslink upon exposure to radiation of between about 10 nm and about 400 nm at a dose of less than about 200 mJ/cm$^2$.

12. The film of claim 11 characterized by a tendency to a reduction in permeability to silicon-containing vapor subsequent to crosslinking of the film.

13. The film of any one of claims 1, 2, or 3 characterized by a tendency to crosslink upon exposure to an electron beam at a dose of less than about 500 $\mu$C/cm$^2$.

14. The film of any one of claims 1, 2, or 3 wherein the level of oxygen constituency is further selected to provide a corresponding selected plasma etch resistance of the film subsequent to silylation of reactive silylation sites in the film.

\* \* \* \* \*